(12) United States Patent
Naumenko et al.

(10) Patent No.: US 8,378,553 B1
(45) Date of Patent: Feb. 19, 2013

(54) BURIED IDT SAW FILTER HAVING LOW PROPAGATION LOSS

(75) Inventors: Natalya Naumenko, Moscow (RU); Benjamin P. Abbott, Maitland, FL (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 134 days.

(21) Appl. No.: 12/829,101

(22) Filed: Jul. 1, 2010

(51) Int. Cl.
*H01L 41/18* (2006.01)

(52) U.S. Cl. .................................................. 310/313 A

(58) Field of Classification Search ............. 310/313 R, 310/313 A, 313 B, 313 C, 313 D
See application file for complete search history.

(56) References Cited

U.S. PATENT DOCUMENTS

| | | | |
|---|---|---|---|
| 6,556,104 B2 | 4/2003 | Naumenko et al. | |
| 6,661,313 B2 | 12/2003 | Naumenko et al. | |
| 6,836,196 B2 | 12/2004 | Kadota et al. | |
| 7,212,080 B2 | 5/2007 | Mimura et al. | |
| 2007/0132339 A1* | 6/2007 | Nishiyama et al. | 310/313 R |

* cited by examiner

*Primary Examiner* — Derek Rosenau

(74) *Attorney, Agent, or Firm* — Schwabe Williamson & Wyatt

(57) ABSTRACT

A SAW resonator with improved temperature characteristics includes a single crystal piezoelectric substrate of symmetry 3 m, providing propagation of leaky waves with quasi-shear horizontal polarization and squared electromechanical coupling coefficient exceeding 5%. A $SiO_x$ overlay having a flattened surface covers the electrode pattern. Electrode thicknesses range from about 0.1% to about 10% of an acoustic wavelength and the $SiO_x$ thickness ranges between zero and 30% of an acoustic wavelength of a surface acoustic wave excited on the surface of the substrate. The piezoelectric substrate has an orientation defined by Euler angles (0±3°, μ, 0±3°), with angle μ=90°−μ' and rotation angle μ', which depends on material of a piezoelectric substrate and thicknesses of electrodes and $SiO_x$ overlay. Such orientations simultaneously combined with optimized thicknesses of electrodes and $SiO_x$ overlay provide for improved performance in RF applications with improved temperature characteristics.

3 Claims, 27 Drawing Sheets

$$\mu_{cpu}(°) = 37.0 + C_{11}h_{cu} + C_{21}h_{cu2} + C_{31}h_{cu}^3$$

where $C_1 = 2.103 - 8.208 \cdot 10^{-2} \cdot h_{SiO2} + 6.069 \cdot 10^{-3} \cdot h_{SiO2}^2 - 1.19 \cdot 10^{-4} \cdot h_{SiO2}^3$ $C_2 = -0.1217 + 2.601 \cdot 10^{-2} \cdot h_{SiO2} - 2.781 \cdot 10^{-3} \cdot h_{SiO2}^2 + 1.129 \cdot 10^{-4} \cdot h_{SiO2}^3 - 1.764 \cdot 10^{-6} \cdot h_{SiO2}^4$ $C_3 = -0.0121 - 2.348 \cdot 10^{-3} \cdot h_{SiO2} + 2.145 \cdot 10^{-4} \cdot h_{SiO2}^2 - 8.489 \cdot 10^{-6} \cdot h_{SiO2}^3 + 1.333 \cdot 10^{-7} \cdot h_{SiO2}^4$ where $C_0 = 43.12 - 0.970 \cdot h_{SiO2} + 0.443 \cdot h_{SiO2}^2 - 0.0246 \cdot h_{SiO2}^3 + 4.123 \cdot 10^{-4} \cdot h_{SiO2}^4$ $C_1 = 28.31 + 3.139 \cdot h_{SiO2} - 0.7254 \cdot h_{SiO2}^2 + 0.0383 \cdot h_{SiO2}^3 - 6.352 \cdot 10^{-4} \cdot h_{SiO2}^4$ $C_2 = -8.599 - 2.119 \cdot h_{SiO2} + 0.395 \cdot h_{SiO2}^2 - 0.0201 \cdot h_{SiO2}^3 + 3.282 \cdot 10^{-4} \cdot h_{SiO2}^4$ $C_3 = 0.9937 + 0.3986 \cdot h_{SiO2} - 0.0677 \cdot h_{SiO2}^2 + 0.00338 \cdot h_{SiO2}^3 - 5.46 \cdot 10^{-5} \cdot h_{SiO2}^4$

BURIED IDT SAW FILTER HAVING LOW PROPAGATION LOSS

FIELD OF INVENTION

The present generally invention relates to surface acoustic wave (SAW) devices and more particularly to a SAW device having simultaneously improved frequency-temperature characteristics and improved performance characteristics for application to RF filtering for wireless communications.

BACKGROUND

SAW devices are successfully used in wireless communication systems as a result of their small size and low insertion loss, which is provided by a resonator-type structure, built on piezoelectric substrates with high electromechanical coupling. Such devices commonly utilize low-attenuated quasi-bulk leaky surface acoustic waves (LSAW) characterized by high electromechanical coupling coefficient. Such waves are known to exist in two piezoelectric crystals, lithium tantalate, $LiTaO_3$ (LT), and lithium niobate, $LiNbO_3$ (LN), by way of example.

Both crystals are oxide ferroelectrics with anti-parallel domain structure and belong to the point symmetry class 3 m. The same symmetry and domain structure determines many common features typical for these two crystals, first of all strong piezoelectric effect. The same type of surface acoustic waves propagates along X-axis in rotated Y-cuts of two crystals (in SAW literature, such orientations are also called 'rotated YX-cuts'). This type of waves is characterized by quasi-SH (shear horizontal) polarization and can be considered as the fast shear bulk wave modified by anisotropy, piezoelectric effect and mass load produced by an electrode pattern of a resonator structure. Leaky waves degenerate into a pure SH-polarized bulk wave in one particular orientation, close to 37° YX cut in LT and close to 41° YX cut on LN, if the effects of electrical boundary conditions and mass load are ignored.

Due to the quasi-bulk structure of the aforementioned type of leaky waves, the electromechanical coupling coefficient, which characterizes piezoelectric efficiency of SAW radiation and determines maximum bandwidth ($BW_{max}$) of SAW devices utilizing these waves, can be nearly as high as the coupling of bulk waves. As substrates of SAW devices with resonator structures, 36° YX-48° YX cuts of LT and 41° YX-76° YX cuts of LN are commonly used. The characteristics of leaky waves propagating in these orientations were reported by Naumenko and Abbott (in Proc. 2002 IEEE Ultrasonics Symposium, pp 385-390 and in Proc. 2003 IEEE Ultrasonics Symposium, pp. 2110-2113).

The performance characteristics of a SAW filter utilizing leaky waves depend on attenuation (propagation loss) caused by radiation of bulk acoustic waves accompanying LSAW propagation. Low attenuation of LSAW is necessary to provide low insertion loss in SAW filters. An attenuation coefficient is an anisotropic parameter. Therefore, it can be minimized by using optimal orientation of piezoelectric crystal as a substrate. On the other side, the attenuation coefficient is a frequency-dependent parameter, which means that it can be minimized only at fixed frequency and can grow significantly with deviation from this specific frequency. For example, the propagation loss can be minimized at the frequency located at the lower edge of the resonator Bragg's stopband. If an electrical boundary condition in a resonator structure is short-circuited (SC), the lower edge of the stopband usually coincides with a resonant frequency. With an open-circuit (OC) electrical boundary condition, it usually coincides with anti-resonant frequency. U.S. Pat. No. 6,661,313 and U.S. Pat. No. 6,556,104, the disclosures of which are herein incorporated by reference in their entirety, teach that when the propagation loss is minimized at the frequency located in the middle between resonance and anti-resonance, in addition to low insertion loss, the shape factor of the resonator filter can be improved. With such an optimization criterion, the optimal dependences between electrode thickness and rotation angle were determined in the aforementioned patents, respectively, for rotated YX-cuts of LT and rotated YX-cuts of LN.

By way of example, reference is made to FIG. 1 illustrating the intervals in which the values of a squared electromechanical coupling coefficient $k^2$ are confined for rotated YX-cuts of LT and LN, if electrode thickness is optimized to provide average propagation loss lower than 0.02 dB/λ or lower than 0.05 dB/λ. In 36° YX-48° YX cuts of LT, these intervals are $k^2$=(7.3-8.2) % and $k^2$=(7-9.5) %, respectively. In 41° YX-76° YX cuts of LN, the corresponding intervals are $k^2$=(11-17.5) % and $k^2$=(9-18) %, respectively. Such values of electromechanical coupling coefficients are sufficient to build resonator SAW filters with maximum bandwidths between 3 and 8%. The choice of material of a substrate and particular orientation depends on a required bandpass width of SAW filter.

Another characteristic of the wave which affects the choice of a substrate material and orientation for SAW device is Temperature Coefficient of Frequency (TCF), which determines stability of the main parameters of SAW filter to variation of temperature. For leaky waves propagating in aforementioned orientations, TCF varies between 30 ppm/° C. and 40 ppm/° C. for rotated Y-cuts of LT and between 60 ppm/° C. and 80 ppm/° C. for rotated Y-cuts of LN, dependent on orientation and electrical boundary condition. The temperature characteristic of SAW filter can be improved if a thin isotropic film of dielectric material with positive TCF, such as silicon dioxide, $SiO_x$, is disposed on the substrate, over the resonator structures. Due to the opposite signs of TCF in the substrate and overlay materials, small or even zero absolute values of the TCF can be obtained in such devices.

As described in M. Kadota, in Proc. Ultrasonic Symposium 2007, pp. 496-506, Kadota reports the type of layered structure, which combines LT or LN substrate with a $SiO_x$ overlay and can be utilized in resonator-type filters with improved temperature characteristics. To provide high electromechanical coupling factor in such devices, the surface of $SiO_x$ film is preferably flattened, as illustrated in FIG. 2, and as will be described in greater detail for a description of embodiments. In addition, to provide efficient reflection of SAW from the resonator structure, the electrodes of resonator-type elements are made of material with density higher than the density of aluminum. For example, copper (Cu) can be used as a primary component of electrode material. Kadota shows that the absolute value of the TCF about 10 ppm/° C. or less can be obtained in SAW devices built on LT or LN substrate with Cu electrodes and $SiO_x$ overlay when the thickness of $SiO_x$ overlay is about 40-60% of LSAW wavelength.

Deposition of $SiO_x$ film over the resonator-type elements of SAW filter changes all leaky wave characteristics, including attenuation. The optimal combination of orientation and electrode thickness, which provides minimum attenuation of leaky wave, depends on $SiO_x$ film thickness. By way of example, FIG. 3 illustrates an average propagation loss estimated in the middle between resonant and anti-resonant frequencies, as function of Cu electrode thickness, in three orientations of LT, 36° YX, 42° YX and 48° YX cuts. The effect of $SiO_x$ film on the characteristics of LSAW propagating in these orientations was simulated assuming that $SiO_x$ film can be adequately characterized by material constants as reported by H. Nakahata et al., in Proc. Ultrasonic Symposium, 1995, pp. 361-370 (Nakahata), and material constants of LT and LN are consistent with the values reported by Kushibiki in IEEE Trans. Ultrason., Ferroelect., Freq. Contr., 1999, v. 46, pp. 1315-1323 (Kushibiki). The characteristics of LSAW obtained with the material constants mentioned above are consistent with experimental LSAW characteristics measured by Kadota, as will be described later.

From FIG. 3, it is clear that without the $SiO_x$ film, a minimum propagation loss is expected in 42°YX and 48°YX cuts, respectively, at the normalized electrode thicknesses 1.7% λ and 3.8% λ, where λ=2p is a wavelength at synchronous resonance condition, and p is periodicity of electrode structure. If $SiO_x$ is disposed between electrodes of resonator structures, with flattened top surface of the whole structure, then the optimal values of electrode thickness, which provide minimum propagation losses, move to 2.5% λ and 5.8% λ, respectively. With deposition of additional $SiO_x$ overlay on top of this structure, the optimal electrode thickness changes and further deviates from the initial electrode thicknesses providing minimum propagation loss without $SiO_x$ overlay.

Thus, optimization is required for each $SiO_x$ film thickness, by means of variation of cut angle and electrode thickness. In U.S. Pat. No. 6,836,196 to Kadota et al., an example of such optimization is presented, reference being made to FIG. 17 of the Kodota patent. The optimal rotation angles were found for rotated YX-cuts of LT, as functions of $SiO_x$ film thickness, at Cu electrode thicknesses 2% λ, 4% λ, 6% λ and 8% λ, in order to minimize propagation loss at resonant frequency. The main disadvantage of such optimization is that it is unable to provide low propagation loss in the middle and at the high-frequency edge of resonator Bragg's stopband and in the middle of filter passband. Moreover, asymmetry of the attenuation coefficient, with respect to the center of the stopband, may cause additional distortion of the frequency characteristic and degradation of steepness (shape factor) at the high-frequency edge of filter passband.

FIG. 4 illustrates how the propagation losses, estimated at resonant and anti-resonant frequencies, depend on electrode thickness, in 42°YX cut of LT with Cu as electrode material. Without a $SiO_x$ overlay, simultaneously low propagation losses, about 0.002 dB/λ, are expected at resonant and anti-resonant frequencies if electrode thickness is about 1.8% λ. With a $SiO_x$ film having thickness $h_{SiOx}$=10% λ (the thickness of $SiO_x$ overlay is measured on top of electrode, as shown in FIG. 1), the optimal electrode thickness increases to $h_{Cu}$=2.95% λ, and the minimum average propagation loss grows up to 0.006 dB/λ. However, this minimum propagation loss can be decreased if the cut angle is adjusted with $SiO_x$ film thickness, by means of simultaneous variation of cut angle and electrode thickness.

FIG. 5 and FIG. 6 include contour plots of propagation losses of leaky waves in rotated YX-cuts of LT, at resonant and anti-resonant frequencies, respectively. The propagation losses were evaluated as functions of rotation angle and normalized electrode thickness, for LT substrates with resonators comprising Cu electrodes and $SiO_x$ overlay, when $h_{SiOx}$=20% λ. In the shaded area, which was reported as optimal area by Kadota (U.S. Pat. No. 6,836,196), the propagation loss estimated at resonant frequency is less than 0.005 dB/λ. See FIG. 5. However, at anti-resonant frequency (see FIG. 6), attenuation in the shaded area exceeds 0.04 dB/λ, which is much higher than at resonant frequency. This will cause asymmetric distortion of frequency characteristics of the SAW filter and hence general degradation of filter performance.

To overcome the disadvantage caused by asymmetry of propagation loss in the resonator stopband, U.S. Pat. No. 7,212,080 to Mimura et al. (Mimura) investigated Q-factors of LSAW resonator at resonant and anti-resonant frequencies, as functions of cut angle, in rotated YX-cuts of LT, at fixed thickness of Cu electrodes, about 4% λ, and fixed thickness of $SiO_x$ film, about 20% λ. Mimura discloses that propagation loss is simultaneously minimized at resonant and anti-resonant frequencies if such resonator structure is built on orientation close to 45° YX cut of LT. However, Mimura does not show how this optimal orientation changes with variation of Cu and $SiO_x$ film thicknesses, though such variation is required to build resonator filters with different passband widths and improved TCF. The dependencies between the optimal cut angles, in rotated YX-cuts of LT and LN, and thicknesses of electrodes and $SiO_x$ film overlay are strongly required to build low-loss resonator filters with improved performance, improved temperature characteristics and wide range of passband widths.

SUMMARY

In view of the foregoing background, embodiments of the present invention are herein described. One embodiment in keeping with the teachings of the invention may comprise a surface acoustic wave device including a piezoelectric substrate, a pattern of electrodes, with Cu as a primary component of electrode material, and an $SiO_x$, (where X is a real number) overlay having positive temperature coefficient of frequency, such that the frequency-temperature characteristic of the device is improved, wherein the substrate material provides piezoelectric coupling sufficient to build devices with fractional bandwidth at least 3%, and its orientation is optimized for pre-selected thicknesses of $SiO_x$ overlay and Cu electrodes, to provide low propagation loss simultaneously at resonant and anti-resonant frequencies of SAW resonators.

Improved performance for a SAW filter with improved temperature-frequency characteristics, and in particular reduced insertion loss and improved shape factor, are provided in SAW filters that may comprise resonator-type elements with $SiO_x$ overlay, resulting from pre-selected orientations of a piezoelectric crystal for simultaneous minimization of propagation loss at resonant and anti-resonant frequencies, while the electrode thickness varies in the range between 0.1% λ and 10% λ and the thickness of $SiO_x$ overlay varies between 10% and 40%, for electrode patterns containing Cu as a primary component.

By way of example, embodiments of the invention satisfy a strong need to provide substrate cuts of Lithium Tantalate with average propagation loss less than 0.02 dB/λ and squared electromechanical coupling of SH-type leaky wave propagating in such substrate varying between 5.5% and 8.5%, while the electrode thickness is in the interval from 0.1% λ to 10% λ, for electrode patterns containing Cu as a primary component and $SiO_x$ film disposed between electrodes and over electrode pattern, while the thickness of additional $SiO_x$ overlay varies between zero and 40%, to provide improved temperature-frequency characteristics.

An embodiment of the invention may include substrate cuts of Lithium Niobate with average propagation loss less than 0.02 dB/λ and squared electromechanical coupling of SH-type leaky wave propagating in such substrate varying between 7 and 16%, while the electrode thickness is in the interval from 0.1% λ to 3% λ, for electrode patterns containing Cu as a primary component and $SiO_x$ film disposed between electrodes and over electrode pattern, while the thickness of $SiO_x$ overlay varies between zero and 40%, to provide improved temperature-frequency characteristics.

Another embodiment of the present invention may provide substrate cuts of Lithium Niobate with average propagation loss less than 0.05 dB/λ and squared electromechanical coupling of SH-type leaky wave propagating in such substrate varying between 7 and 18%, while the electrode thickness is in the interval from 0.1% λ to 3% λ, for electrode patterns containing Cu as a primary component and $SiO_x$ film disposed between electrodes and over electrode pattern, while the thickness of $SiO_x$ overlay varies between zero and 40%, to provide improved temperature-frequency characteristics.

Another embodiment of the invention may provide a resonator SAW filter with improved temperature-frequency characteristics and improved performance in the filter passband, due to utilizing optimized substrate cuts of Lithium Tantalate with equal propagation losses at resonant and anti-resonant frequencies, while the electrode thickness is in the interval from 0.1% λ to 10% λ, for electrode patterns containing Cu as a primary component and $SiO_x$ film disposed between electrodes and over electrode pattern, while the thickness of additional $SiO_x$ overlay varies between zero and 40%.

Yet another embodiment of the invention may provide a resonator SAW filter with improved temperature-frequency characteristics and improved performance in the filter passband, due to utilizing optimized substrate cuts of Lithium Niobate with equal propagation losses at resonant and anti-resonant frequencies, while the electrode thickness is in the interval from 0.1% λ to 3% λ, for electrode patterns containing Cu as a primary component and $SiO_x$ film disposed between electrodes and over electrode pattern, while the thickness of $SiO_x$ overlay varies between zero and 40%.

BRIEF DESCRIPTION OF DRAWINGS

Other features and advantages of the present invention will become more apparent from the following detailed description of embodiments with reference to the attached drawings, in which.

DESCRIPTION OF EMBODIMENTS

Prior to a detailed description of embodiments of the present invention, one orientation procedure will be further described to define a substrate cut and propagation direction of LSAW within this cut, according to specified Euler angles (λ, µ, θ). As illustrated with reference to FIG. 7A, initial coordinate axes X,Y,Z fixed along crystal axes of LiTaO3, according to the Euler angle convention, first, auxiliary axis X' (positive direction) is obtained by rotation from positive X axis towards positive Y axis by the angle λ. The outward normal to the substrate cut Z' is found then by rotation about auxiliary axis X' from positive Z axis, by the angle µ counterclockwise, as viewed from positive X'. Finally, the direction of surface wave propagation X" is found by rotation about Z' from positive X' axis by the angle θ counterclockwise, as viewed from positive Z' axis. Orientations with Euler angles (0, µ, 0) can be referred to as rotated Y-cuts, X-propagation, or µ'-rotated YX-cuts, where the rotation angle µ'=µ+90°, or µ'=µ−90° if µ>180°.

The present invention will now be described more fully hereinafter with reference to the accompanying drawings, in which embodiments of the invention are shown.

Figure 2:
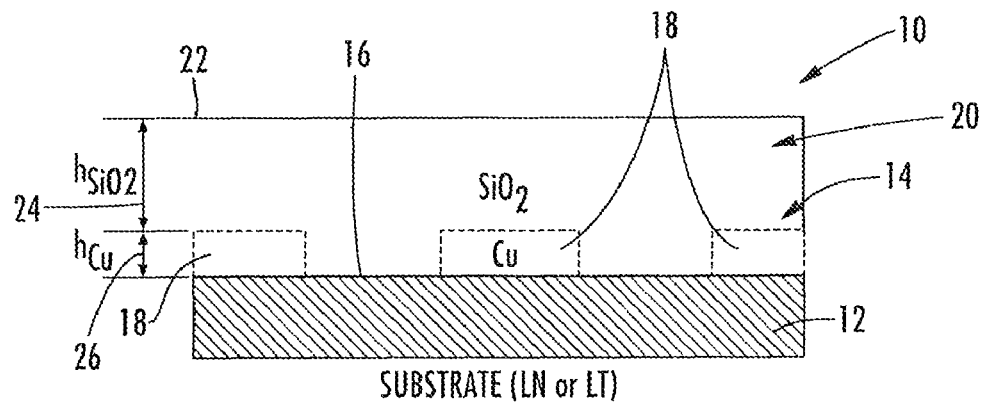
FIG. 2 is a schematic illustration showing a cross-section of a resonator structure, with Cu electrodes disposed on a substrate made of rotated YX-cut of lithium tantalate or lithium niobate and covered by thin layer of dielectric $SiO_x$ film, the thickness of $SiO_x$ overlay, $h_{SiOx}$, is measured on the top of electrode as illustrated.
Figure 3:
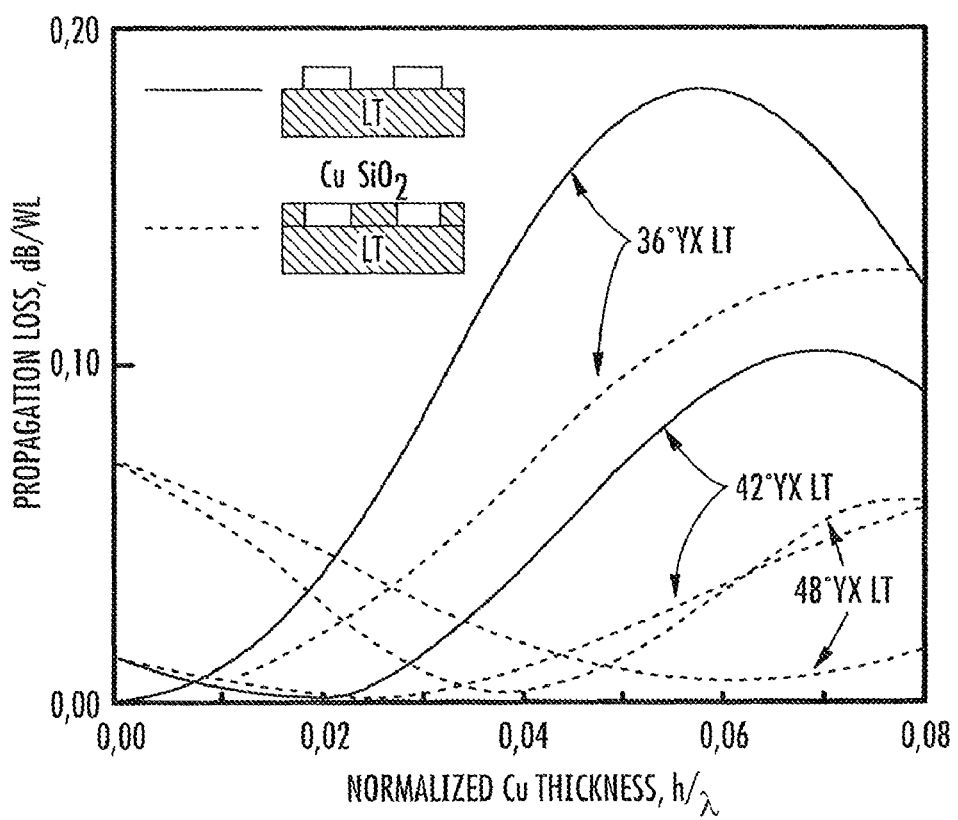
FIG. 3 illustrates the effect of $SiO_x$ film disposed between Cu electrodes of resonator structure, on average propagation loss, in three orientations of $LiTaO_3$: 36°YX, 42°YX and 48°YX cuts, an average propagation loss is estimated in the middle between resonant and anti-resonant frequencies.
Figure 4:
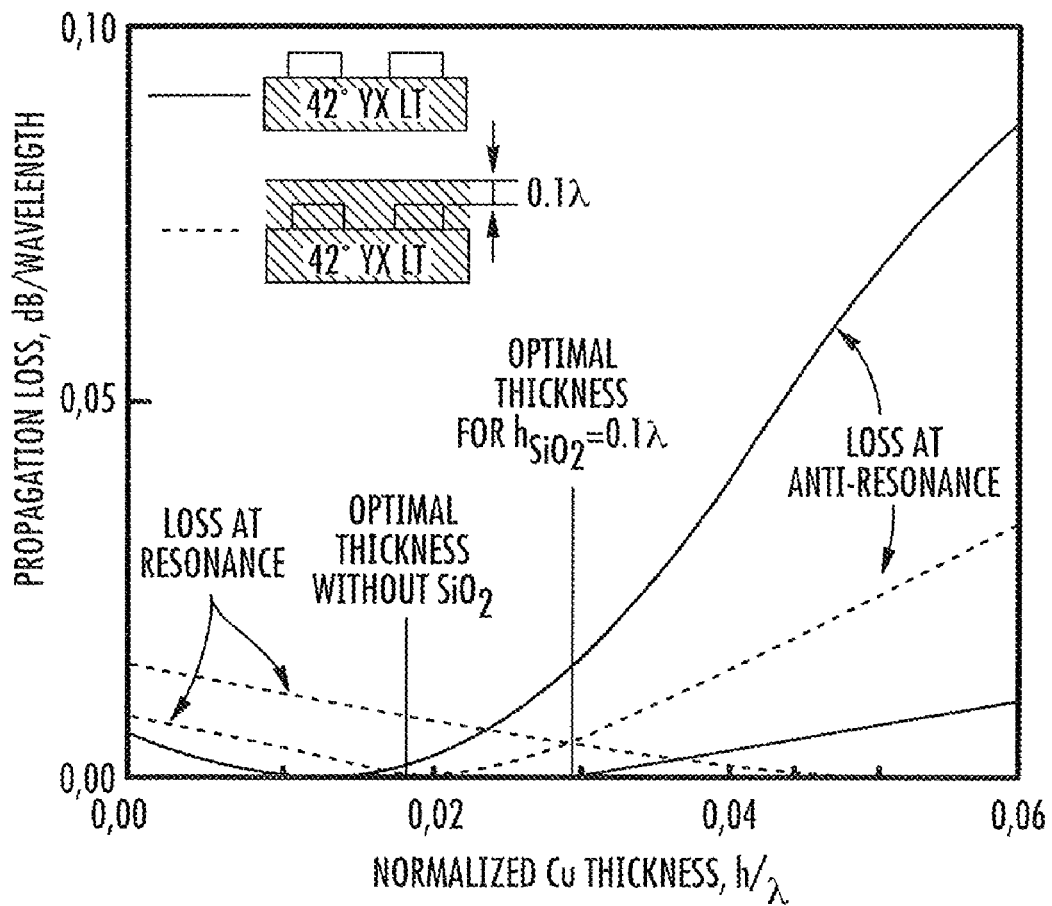
FIG. 4 graphically shows propagation losses at resonant and anti-resonant frequencies, for LSAW on 42°-rotated YX cut of $LiTaO_3$, as functions of Cu electrode thickness normalized to wavelength, when $SiO_x$ film is absent and when it is present and the thickness of overlay is $h_{SiOx}$=0.1λ, where λ is LSAW wavelength, and optimal thickness of electrode is characterized by equal propagation loss at resonant and anti-resonant frequencies.
Figure 5:
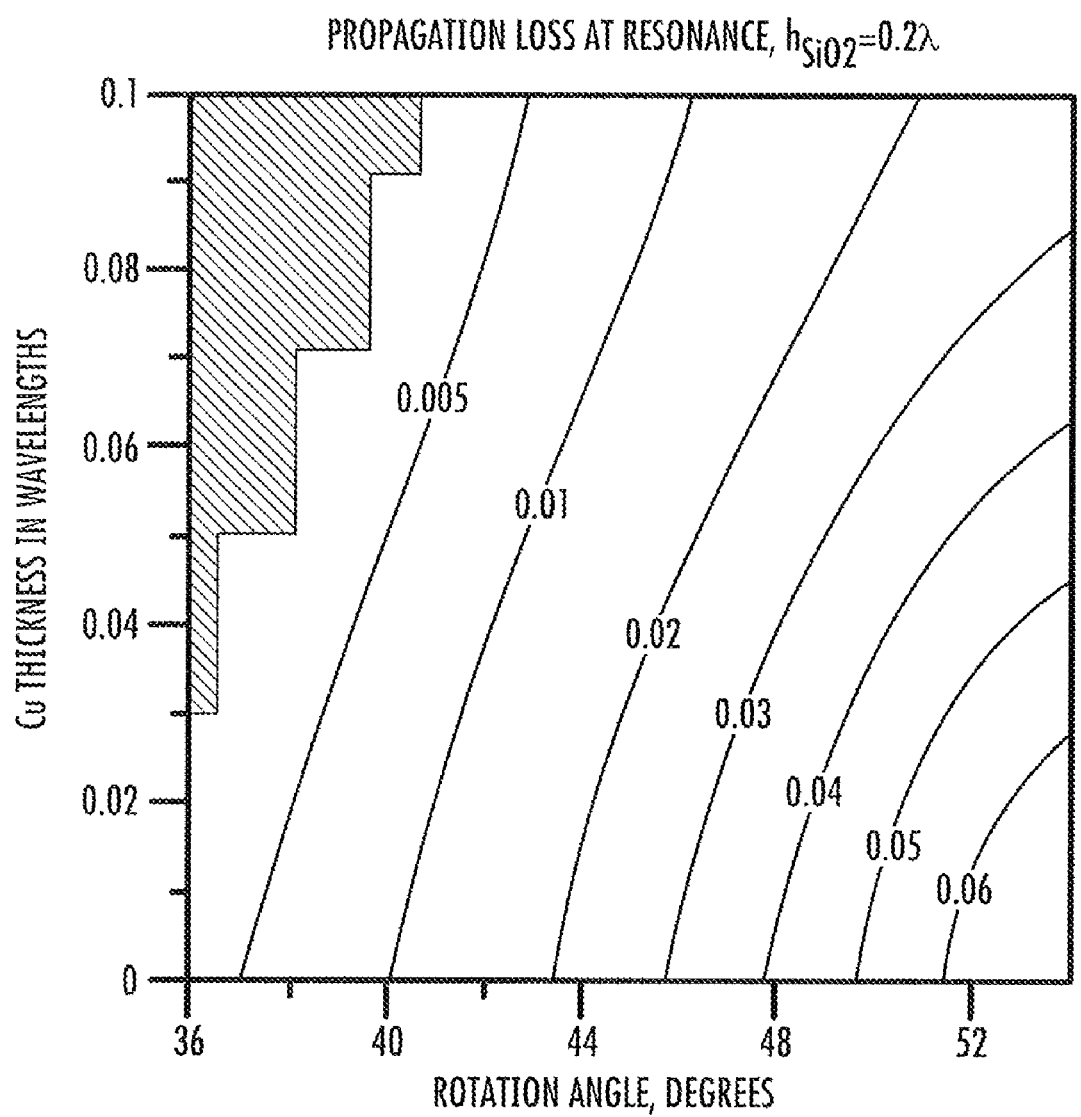
FIG. 5 is a contour plot of propagation loss at resonant frequency, as function of rotation angle μ' and normalized electrode thickness, for pattern with Cu electrodes on μ'-rotated YX cut of $LiTaO_3$, when the thickness of $SiO_x$ overlay is $h_{SiOx}$=0.2λ, the shaded area illustrates optimal intervals of rotation angles as functions of electrode thickness, according to the prior art.
Figure 6:
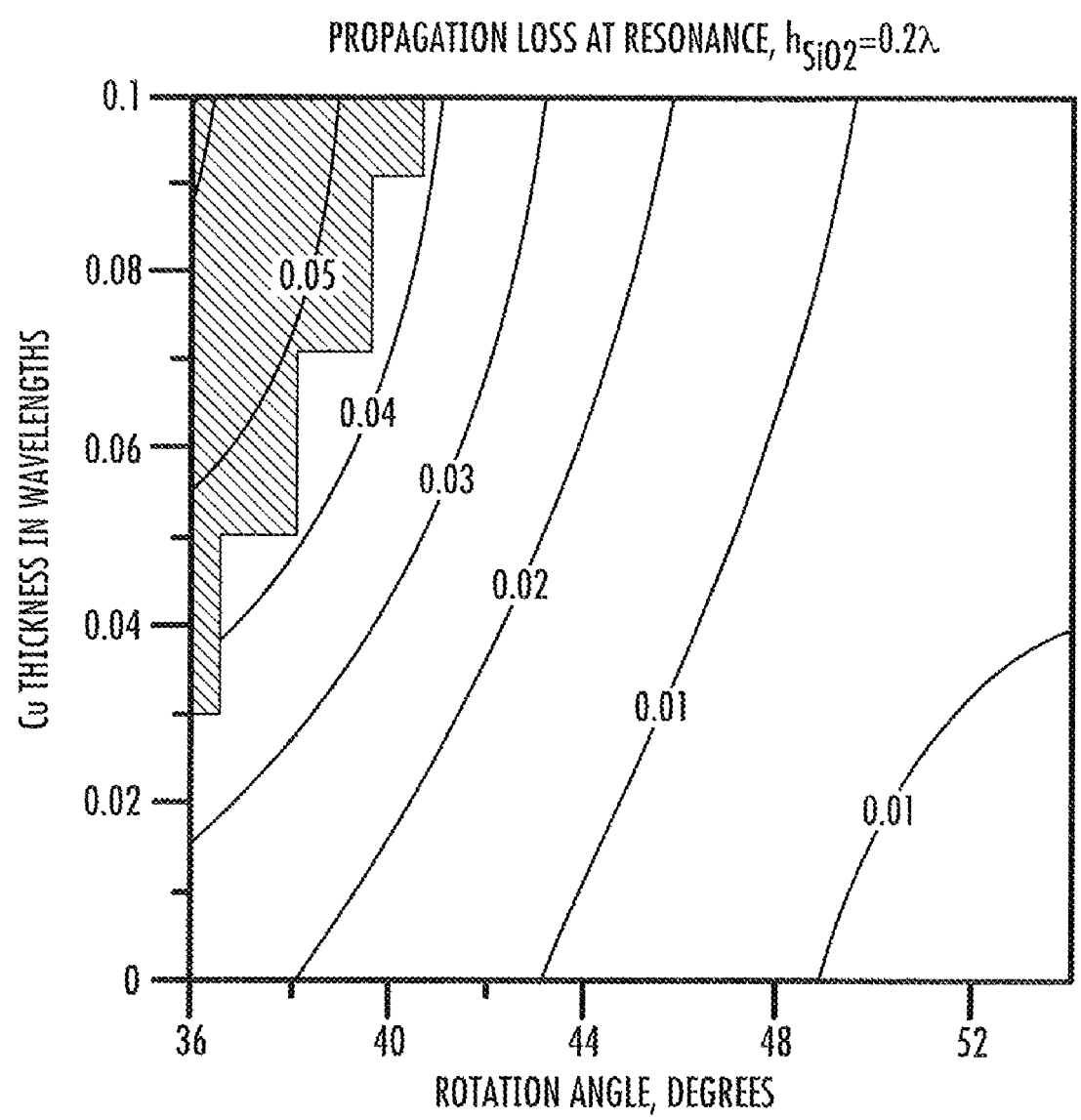
FIG. 6 is a contour plot of propagation loss at anti-resonant frequency, as function of rotation angle μ and normalized electrode thickness, for pattern with Cu electrodes on μ-rotated YX cut of $LiTaO_3$, when the thickness of $SiO_x$ overlay is $h_{SiOx}$=0.2λ, the shaded area illustrates optimal intervals of rotation angles as functions of electrode thickness, as known in the art.

With reference again to FIG. 2, one embodiment of the invention may be described as a surface acoustic wave device 10 comprising a piezoelectric substrate 12 of a single crystal, wherein an electrode pattern 14 is disposed on a surface 16 of the piezoelectric substrate. The electrode pattern 14 includes electrodes 18 having Cu as a primary electrode material. For the embodiment herein described by way of example, the electrode pattern 14 forms a resonator. With continued reference to FIG. 2, a dielectric overlay 20 of silicon dioxide, wherein the dielectric overlay is disposed between and over the electrodes 18 of the electrode pattern 14. Yet further, the dielectric overlay 20 includes a generally flattened surface 22 and has a thickness 24 that will further be addressed later in this section.

Figure 7:
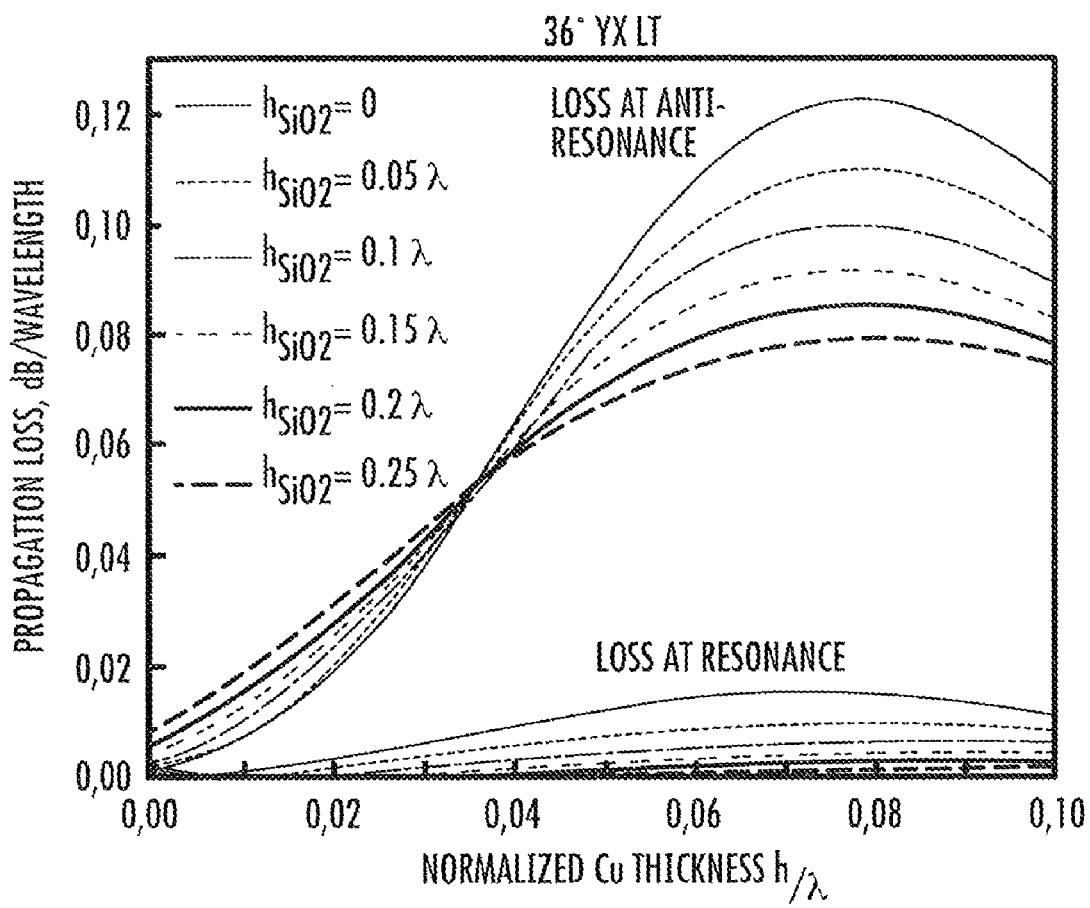
FIG. 7 graphically shows the variation of propagation loss at resonant and anti-resonant frequencies with increasing of $SiO_x$ overlay thickness from zero to 0.25λ, in 36°-YX cut of $LiTaO_3$.
Figure 7A:
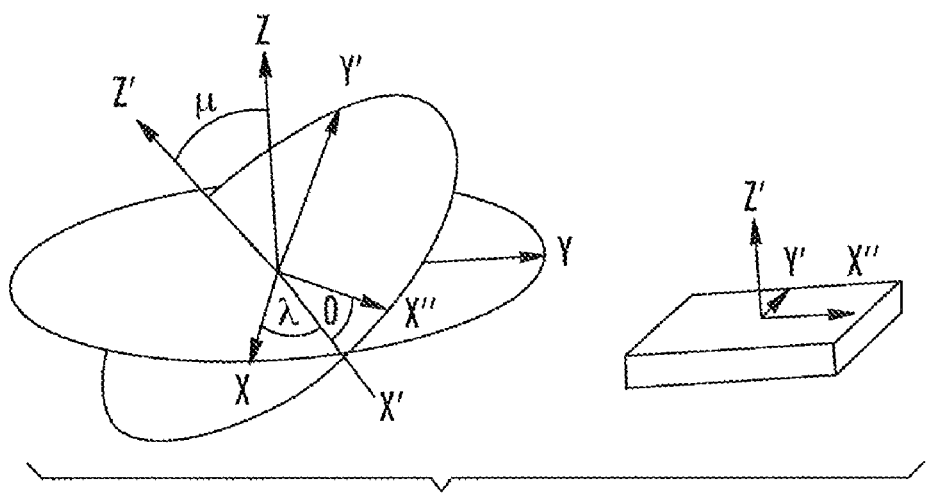
FIG. 7A diagrammatically illustrates an orientation of a crystal plane and propagation direction in this plane using Euler Angles with reference to initial crystal axes, X, Y, Z.
Figure 8:
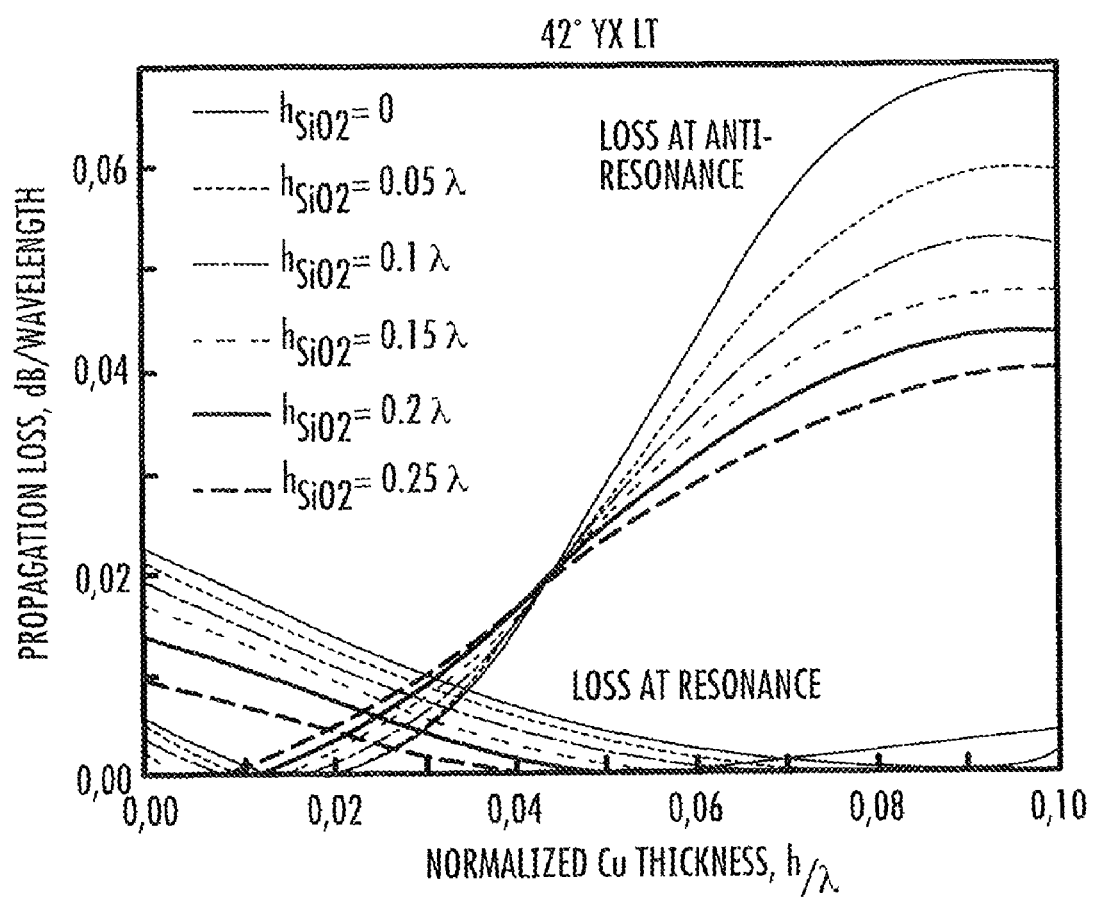
FIG. 8 graphically shows the variation of propagation loss at resonant and anti-resonant frequencies with increasing of $SiO_x$ overlay thickness from zero to 0.25λ, in 42°-YX cut of $LiTaO_3$.
Figure 9:
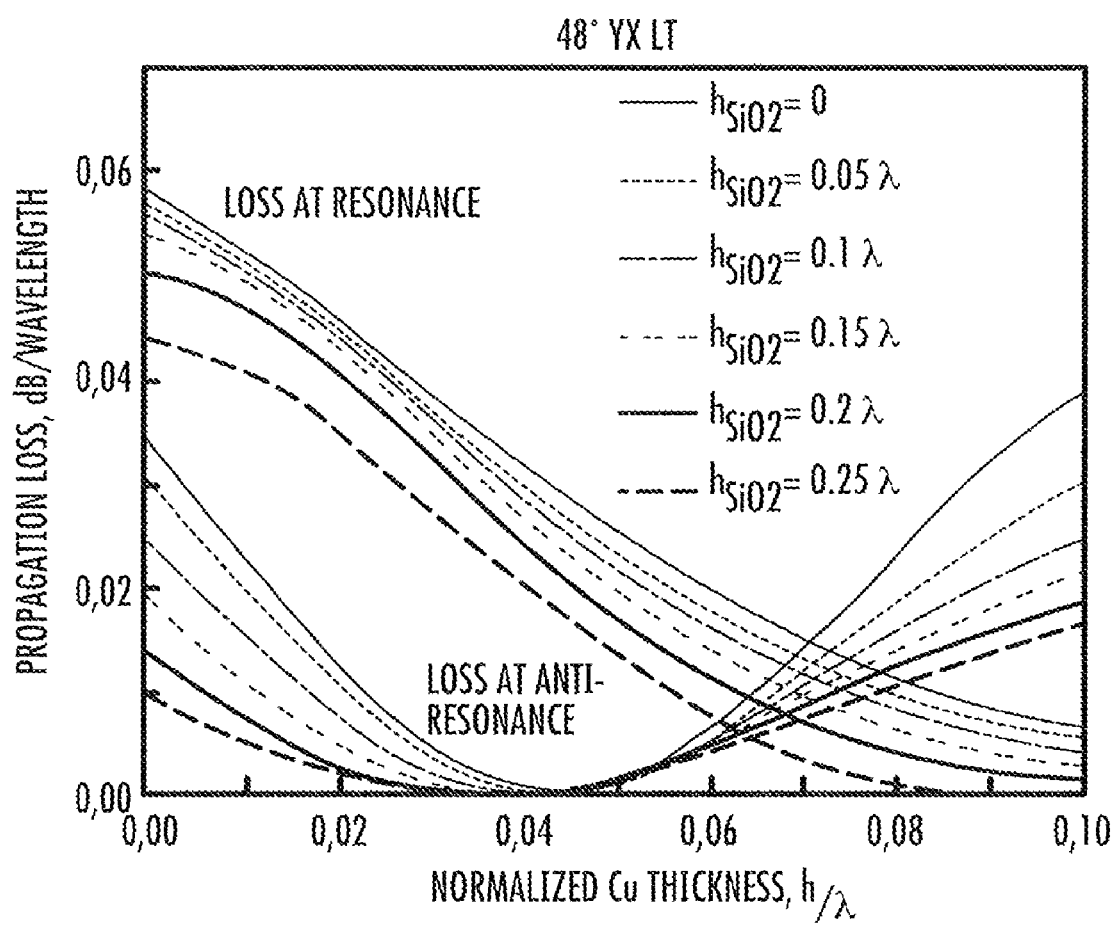
FIG. 9 graphically shows the variation of propagation loss at resonant and anti-resonant frequencies with increasing of $SiO_x$ overlay thickness from zero to 0.25λ, in 48°-YX cut of $LiTaO_3$.
Figure 10:
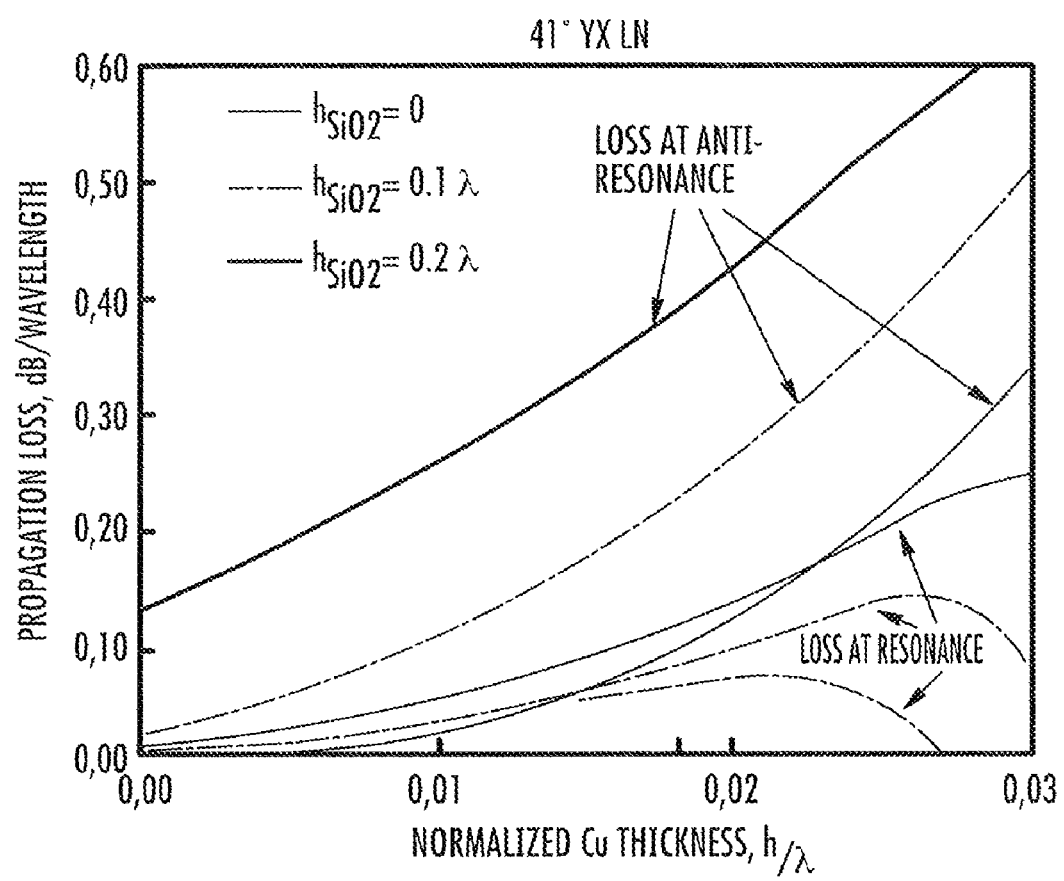
FIG. 10 graphically shows the variation of propagation loss at resonant and anti-resonant frequencies with increasing of $SiO_x$ overlay thickness from zero to 0.2λ, in 41°-YX cut of $LiNbO_3$.
Figure 11:
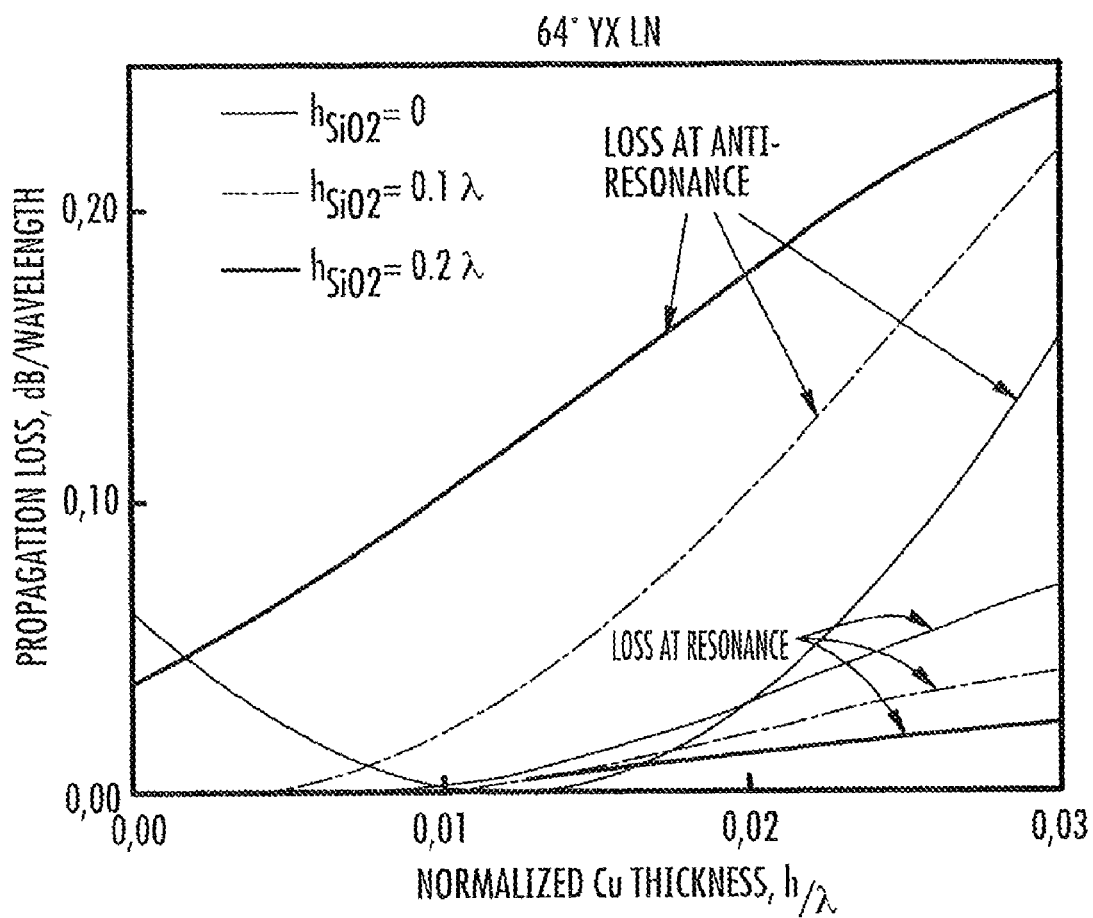
FIG. 11 graphically shows the variation of propagation loss at resonant and anti-resonant frequencies with increasing of $SiO_x$ overlay thickness from zero to 0.2λ, in 64°-YX cut of $LiNbO_3$.
Figure 12:
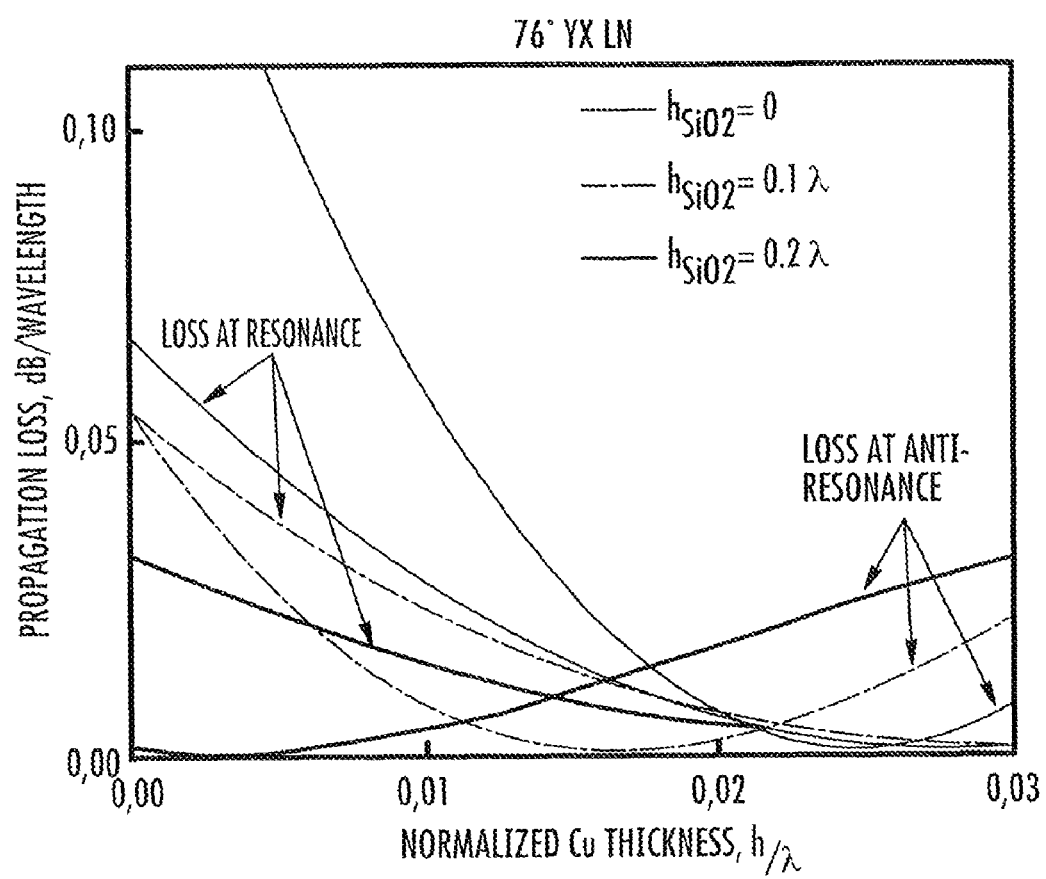
FIG. 12 graphically shows the variation of propagation loss at resonant and anti-resonant frequencies with increasing of $SiO_x$ overlay thickness from zero to 0.2λ, in 76°-YX cut of $LiNbO_3$.
Figure 13:
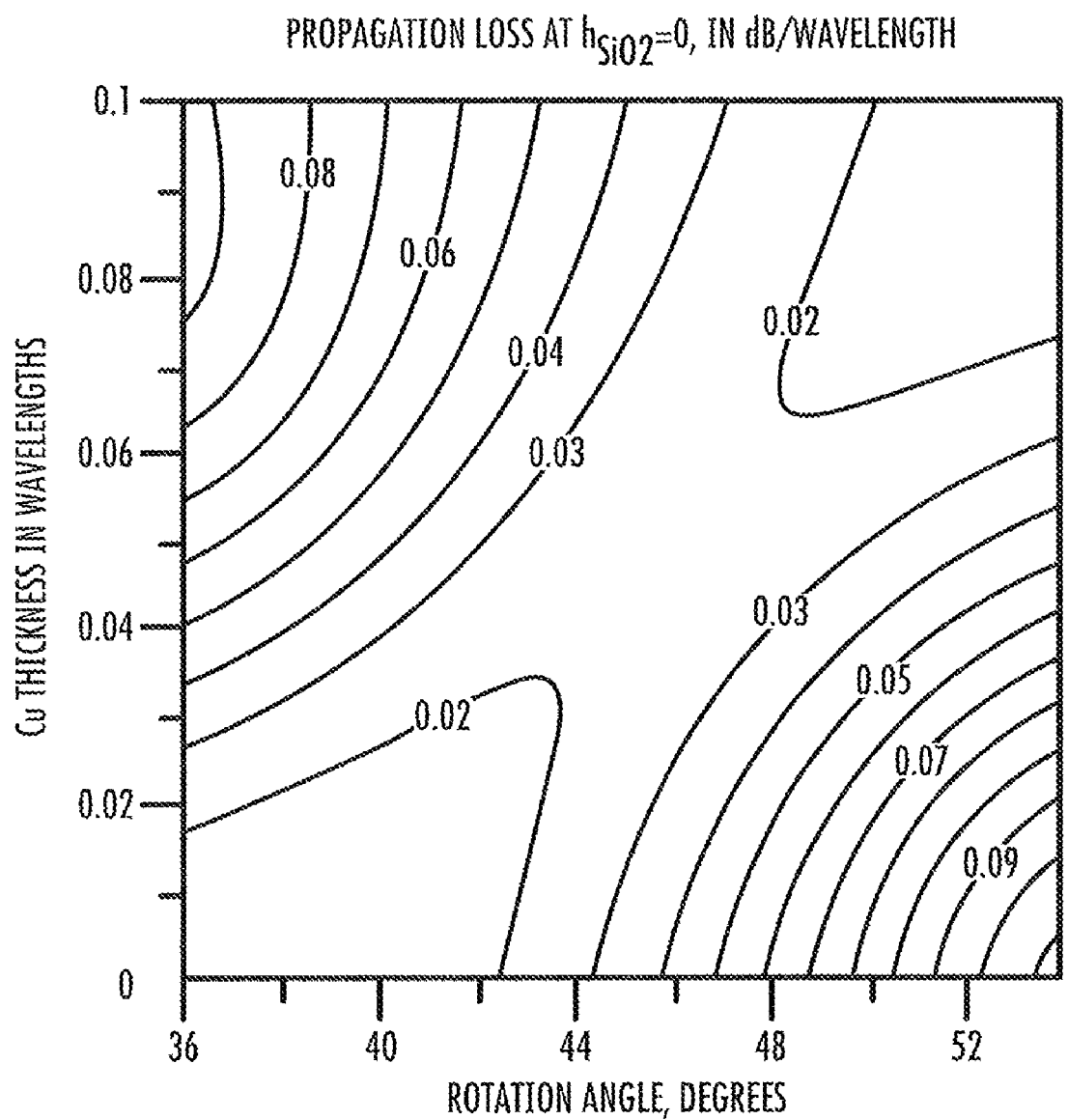
FIG. 13 is a contour plot of average propagation loss, for pattern with Cu electrodes on μ'-rotated YX cut of $LiTaO_3$, when the thickness of $SiO_x$ overlay is zero, $h_{SiOx}$=0, as function of rotation angle μ' and normalized electrode thickness.
Figure 14:
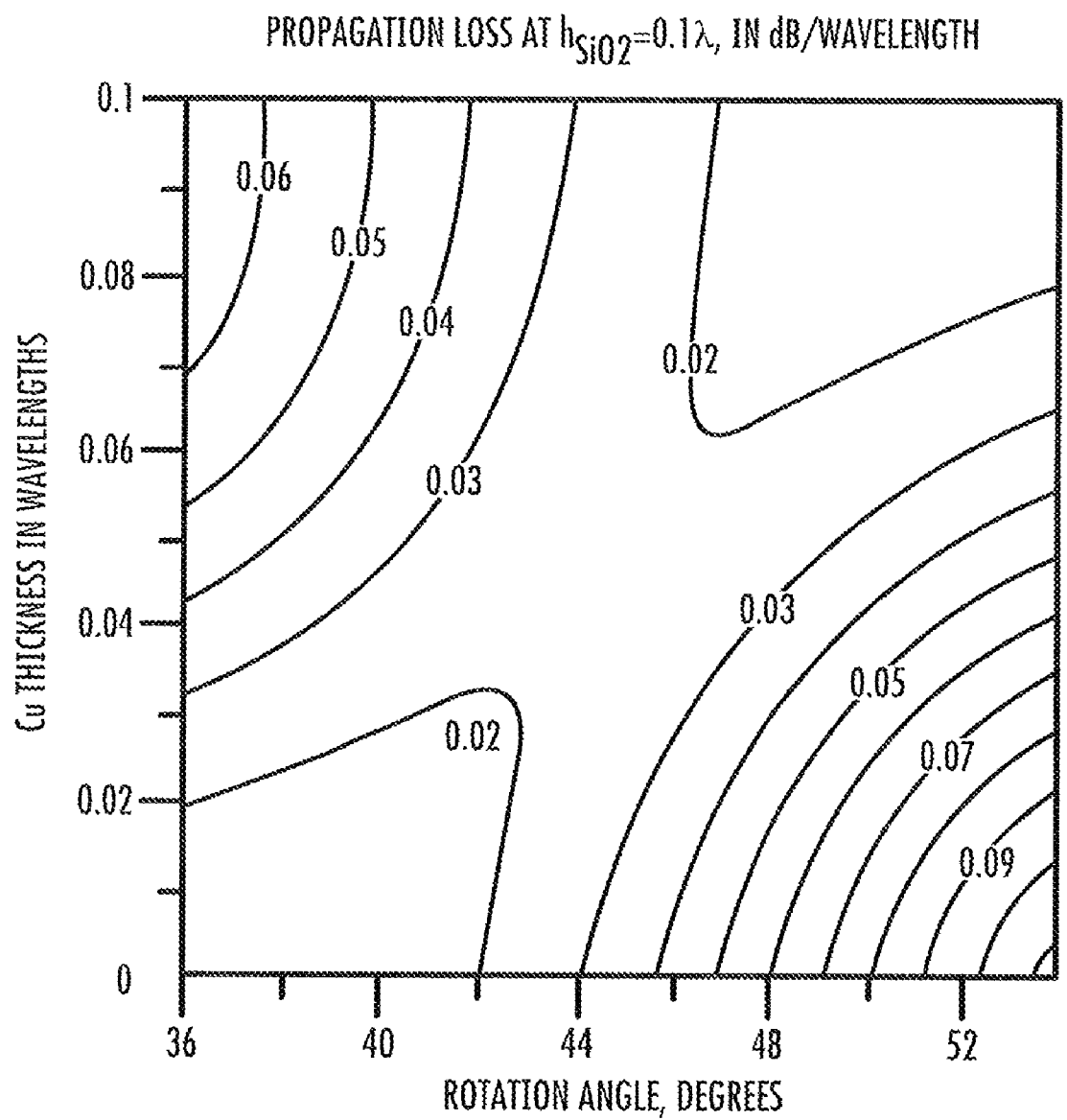
FIG. 14 is a contour plot of average propagation loss, for pattern with Cu electrodes on μ'-rotated YX cut of $LiTaO_3$, when the thickness of $SiO_x$ overlay is zero, $h_{SiOx}$=0.1λ, as function of rotation angle μ' and normalized electrode thickness.
Figure 15:
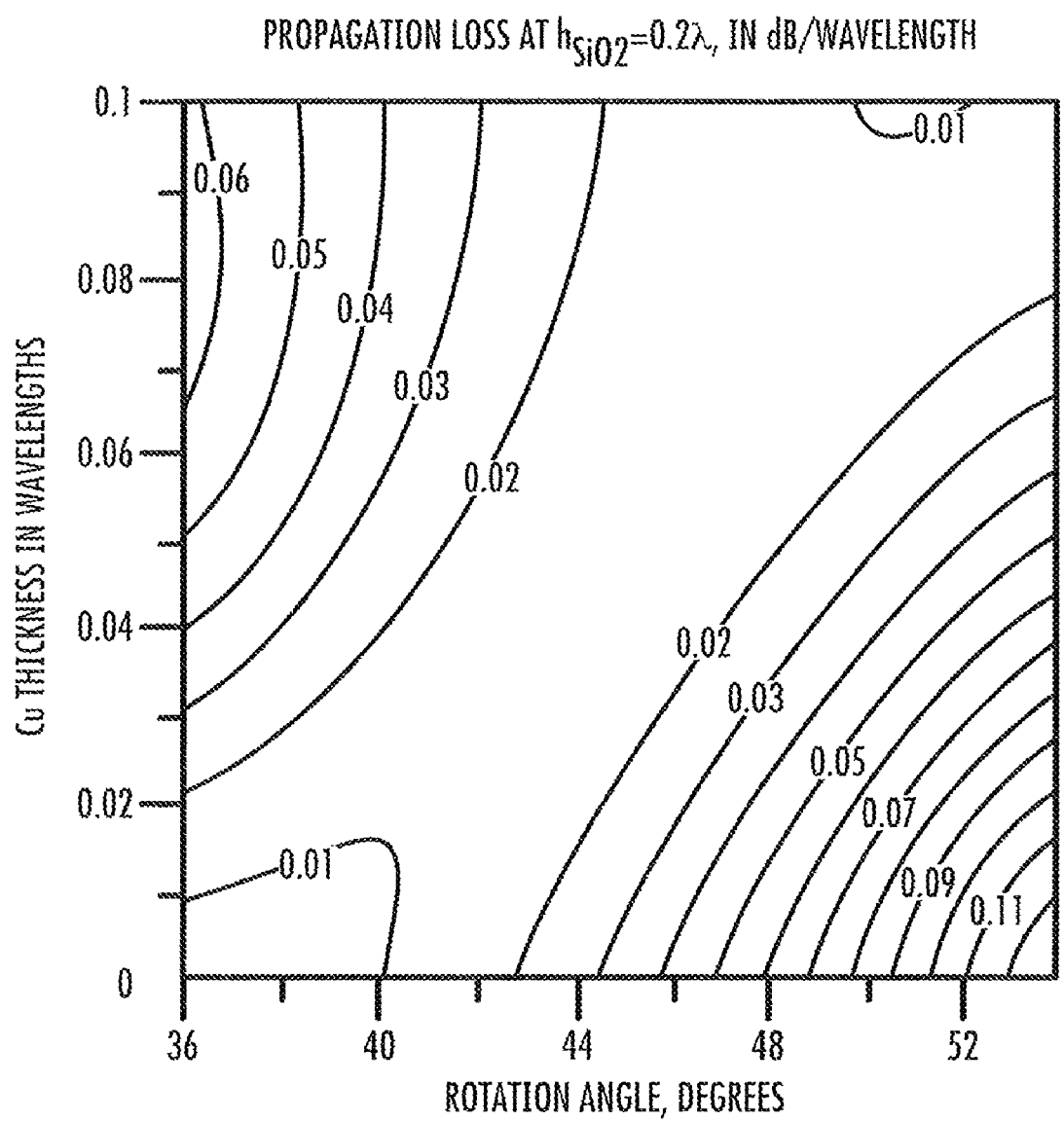
FIG. 15 is a contour plot of average propagation loss, for pattern with Cu electrodes on μ'-rotated YX cut of $LiTaO_3$, when the thickness of $SiO_x$ overlay is zero, $h_{SiOx}$=0.2λ, as function of rotation angle μ' and normalized electrode thickness.
Figure 16:
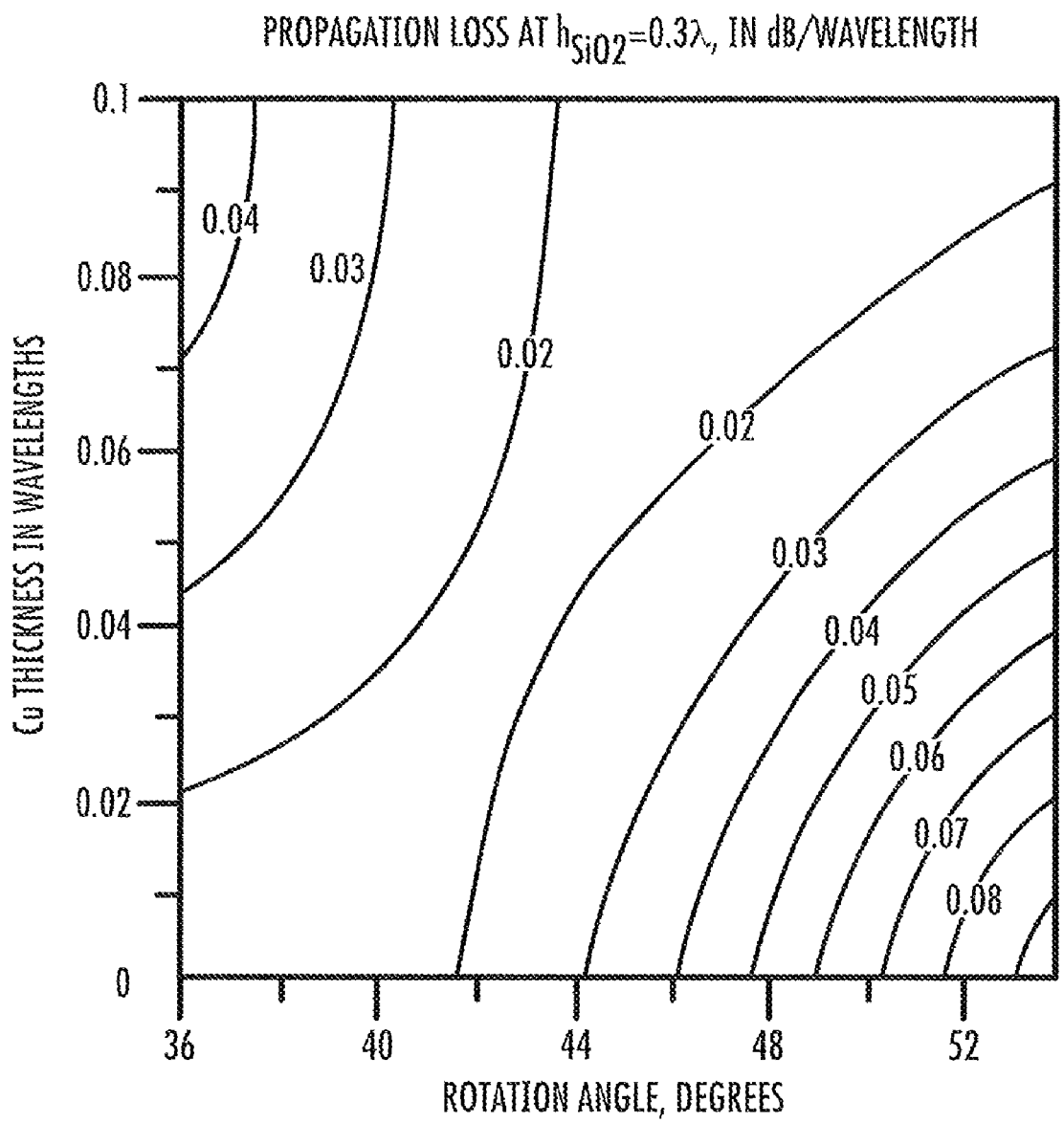
FIG. 16 is a contour plot of average propagation loss, for pattern with Cu electrodes on μ'-rotated YX cut of $LiTaO_3$, when the thickness of $SiO_x$ overlay is zero, $h_{SiOx}$=0.3λ, as function of rotation angle μ' and normalized electrode thickness.

To estimate a change of propagation losses in rotated YX-cuts of LT and LN, when the $SiO_x$ overlay 20 is disposed between the electrodes 18 of the resonator structures and over these electrodes, the propagation losses were determined at resonant and anti-resonant frequencies, as functions of an electrode thickness 26, where Cu is a primary material of the electrode 18, for selected values of the $SiO_x$ overlay thickness 20. The found dependences are shown in FIGS. 7-9, for three rotated YX-cuts of LT, 36° YX, 42° YX and 48° YX, with $h_{SiOx}$ varying between zero and 25% λ, and in FIGS. 10-12, for three rotated YX-cuts of LN, 41° YX, 64° YX and 76° YX cuts, with $h_{SiOx}$ varying between zero and 20%. As illustrated with reference to FIG. 2, a zero thickness of the $SiO_x$ overlay 20 means that $SiO_x$ is disposed only between electrodes 18, to provide flat top surface of the structure.

From FIGS. 7-12, one can see that it is not sufficient to minimize propagation loss at one certain frequency, to provide low insertion loss and high performance of SAW filter, because in general the propagation losses are asymmetric with respect to the middle of the filter passband. For example, as clear from FIG. 9, in 48° YX cut of LT, with $SiO_x$ overlay having thickness $h_{SiOx}$=25% λ and a pattern of Cu electrodes having thickness $h_{Cu}$=3.5% λ, leaky SAW propagates without any attenuation at anti-resonant frequency, while at resonant frequency it has attenuation about 0.035 dB/λ. Similarly, one can see from FIG. 11 that in 64° YX cut of LN, with $SiO_x$ overlay having thickness $h_{SiOx}$=20% λ, electrode thickness $h_{Cu}$=0.5% λ provides nearly zero attenuation of LSAW at resonant frequency and much higher attenuation, about 0.07 dB/λ, at anti-resonant frequency.

Figure 17:
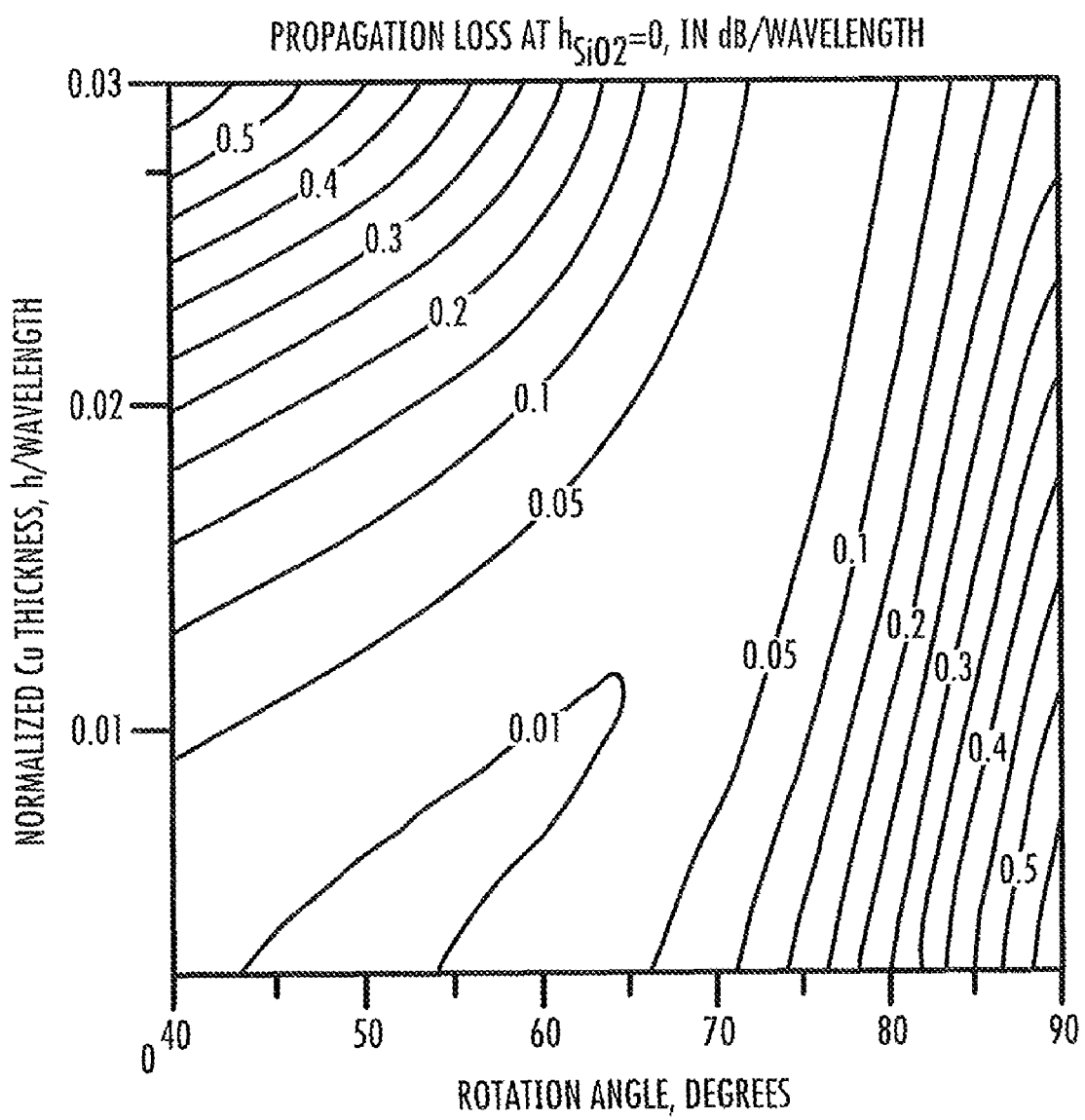
FIG. 17 is a contour plot of average propagation loss, for pattern with Cu electrodes on μ'-rotated YX cut of $LiNbO_3$, when the thickness of $SiO_x$ overlay is zero, $h_{SiOx}$=0, as function of rotation angle μ' and normalized electrode thickness.
Figure 18:
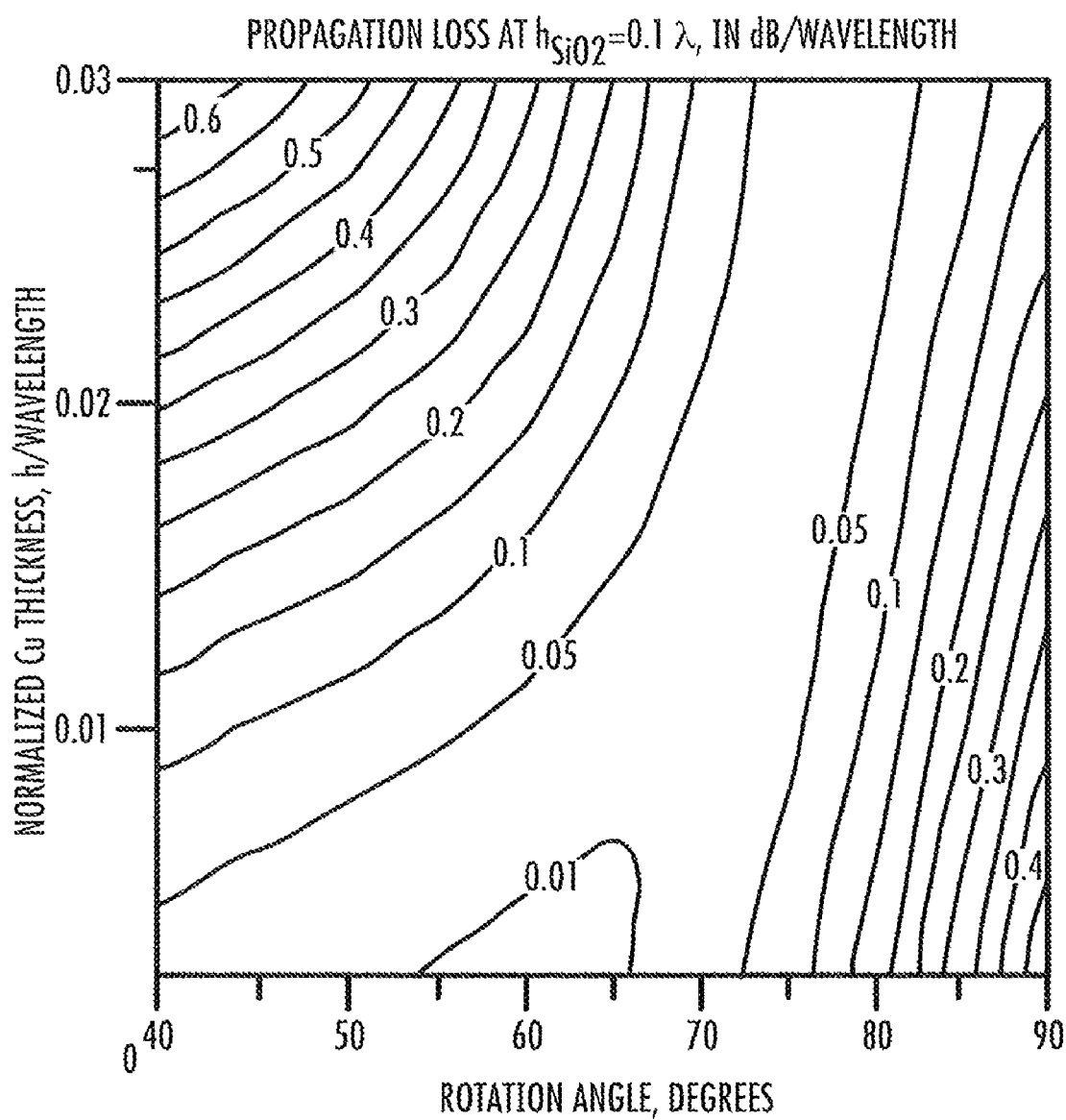
FIG. 18 is a contour plot of average propagation loss, for pattern with Cu electrodes on μ'-rotated YX cut of $LiNbO_3$, when the thickness of $SiO_x$ overlay is zero, $h_{SiOx}$=0.1λ, as function of rotation angle μ' and normalized electrode thickness.
Figure 19:
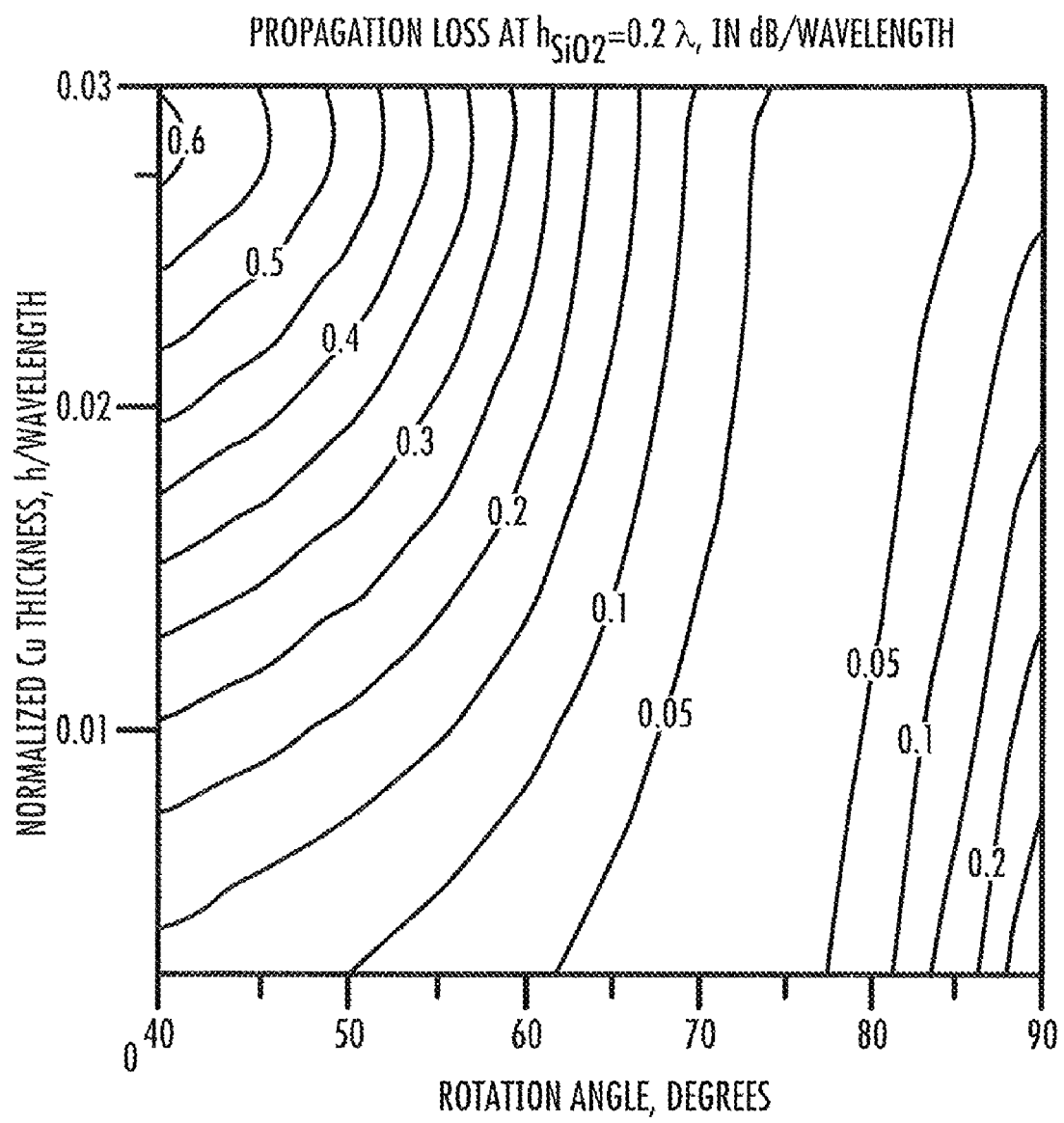
FIG. 19 is a contour plot of average propagation loss, for pattern with Cu electrodes on μ'-rotated YX cut of $LiNbO_3$, when the thickness of $SiO_x$ overlay is zero, $h_{SiOx}=0.2\lambda$, as function of rotation angle µ' and normalized electrode thickness.

The average propagation loss, estimated in the middle between resonant and anti-resonant frequencies, better characterizes insertion loss for any orientation, if the thicknesses of electrodes and $SiO_x$ overlay are fixed. FIGS. 13-16 show the contour plots of average propagation loss in rotated YX-cuts of LT, with $h_{SiOx}$=0, 10% λ, 20% λ and 30% λ and FIGS. 17-19 show the contour plots of average propagation loss in rotated YX-cuts of LN, with $h_{SiOx}$=0, 10% λ and 20% λ. The losses are shown as functions of rotation angle and normalized thickness of electrodes. One can see from these figures that the line of electrode thickness versus rotation angle, which provides minimum average propagation loss, shifts with increasing $SiO_x$ film thickness, for both crystals.

In one embodiment of the present invention, as herein described by way of example, a rotated Y-cut of LT, with rotation angle confined in the interval between 36° and 54°, is used as a piezoelectric substrate, in which leaky SAW propagates and has quasi-SH polarization and high electromechanical coupling, $k^2$, at least 5%. To provide low propagation loss simultaneously at resonant and anti-resonant frequencies, a detailed study of LSAW characteristics was performed in such substrate, with electrode pattern forming resonators, and $SiO_x$ overlay disposed over electrode pattern to improve temperature-frequency characteristics, while Cu is used as primary electrode material. In particular, the propagation losses at resonant and anti-resonant frequencies were studied, as functions of rotation angle and electrode thickness, at few fixed values of $SiO_x$ film thickness, to determine the optimal combinations of these parameters providing simultaneously low propagation losses at resonance and anti-resonance. This study has shown that in rotated YX-cuts of LT, the optimal orientation strongly depends on electrode thickness and shows weak dependence on $SiO_x$ film thickness. However, even with $SiO_x$ disposed only between electrodes, without additional overlay, the optimal angle for each pre-determined Cu thickness is different from such optimal angle determined in U.S. Pat. No. 6,661,313 for rotated YX-cuts of LT without $SiO_x$ film. For example, 48° YX cut of LT provides minimum propagation loss if Cu electrode thickness is between 6% λ and 8% λ, for different $SiO_x$ film thicknesses, while without $SiO_x$ the optimal thickness for this cut is about 4% λ.

To provide attenuation of LSAW less than 0.02 dB/λ, in wide frequency interval between resonance and anti-resonance, the rotation angles μ' are preferably selected within the intervals specified in the following table, dependent on the thickness of electrode varying between zero and 10% λ and the thickness of $SiO_x$ overlay varying between zero and 30% λ, according to the following Table 1:

TABLE 1

| $h_{SiOx}$/λ, % | $h_{Cu}$/λ, % | Rotation angle, degrees |
|---|---|---|
| 0 | 0-2 | 40-45 |
| | 2-4 | 43-47 |
| | 4-6 | 46-49 |
| | 6-8 | 47.5-51.5 |
| | 8-10 | 49-54 |
| 10 | 0-2 | 39-44 |
| | 2-4 | 42-45.5 |
| | 4-6 | 44-47 |
| | 6-8 | 46-49.5 |
| | 8-10 | 47.5-51.5 |
| 20 | 0-2 | 39-43.5 |
| | 2-4 | 41.5-45 |

TABLE 1-continued

| $h_{SiOx}$/λ, % | $h_{Cu}$/λ, % | Rotation angle, degrees |
|---|---|---|
| | 4-6 | 43-46.5 |
| | 6-8 | 44.5-48 |
| | 8-10 | 46-50 |
| 30 | 0-2 | 39-42 |
| | 2-4 | 41-43.5 |
| | 4-6 | 42.5-45.5 |
| | 6-8 | 43.5-47 |
| | 8-10 | 44.5-48.5 |

For each rotation angle μ' in the found optimal intervals, orientation of LT substrate is determined by the Euler angles (0±3°, μ'−90, 0±3°) or (0±3°, μ'+90, 0±3°). Both intervals of orientations provide the same LSAW characteristics, due to crystal symmetry.

With these combinations of orientation and thicknesses of electrodes and $SiO_x$ overlay, the squared electromechanical coupling coefficient $k^2$ of LSAW is confined in the interval between 5.5% and 9%. For example, if LSAW propagates in 44° YX cut of LT with Cu thickness about 4% λ, the coupling $k^2$ decreases from 8.7% to 6.4% with increasing $h_{SiOx}$ from zero to 30% λ, while propagation loss in the frequency interval mentioned above does not exceed 0.02 dB/λ, and the absolute value of TCF decreases from (30-40) to ppm/° C. to (0-10) ppm/° C.

To provide equal propagation losses at resonant and anti-resonant frequencies, and thus to provide possibility of obtaining a desirably symmetric frequency response in SAW filter passband, rotation angle μ' is determined for each Cu electrode thickness and $SiO_x$ overlay thickness as μ'=$μ_{opt}$±1°, where the optimal value of rotation angle $μ_{opt}$, in degrees, is described by the following formulae $$μ_{opt}=37.0+C_1 \cdot h_{Cu}+C_2 \cdot h_{Cu}^2+C_3 \cdot h_{Cu}^3$$

where $$C_1=2.103-8.208 \cdot 10^{-2} \cdot h_{SiOx}+6.069 \cdot 10^{-3} \cdot h_{SiOx}^2-1.19 \cdot 10^{-4} \cdot h_{SiOx}^3$$

$$C_2=0.1217+2.601 \cdot 10^{-2} \cdot h_{SiOx}-2.781 \cdot 10^{-3} \cdot h_{SiOx}^2+1.129 \cdot 10^{-4} \cdot h_{SiOx}^3-1.764 \cdot 10^{-6} \cdot h_{SiOx}^4$$

$$C_3=0.0121-2.348 \cdot 10^{-3} \cdot h_{SiOx}+2.145 \cdot 10^{-4} \cdot h_{SiOx}^2-8.489 \cdot 10^{-6} \cdot h_{SiOx}^3+1.333 \cdot 10^{-7} \cdot h_{SiOx}^4$$

Figure 20:
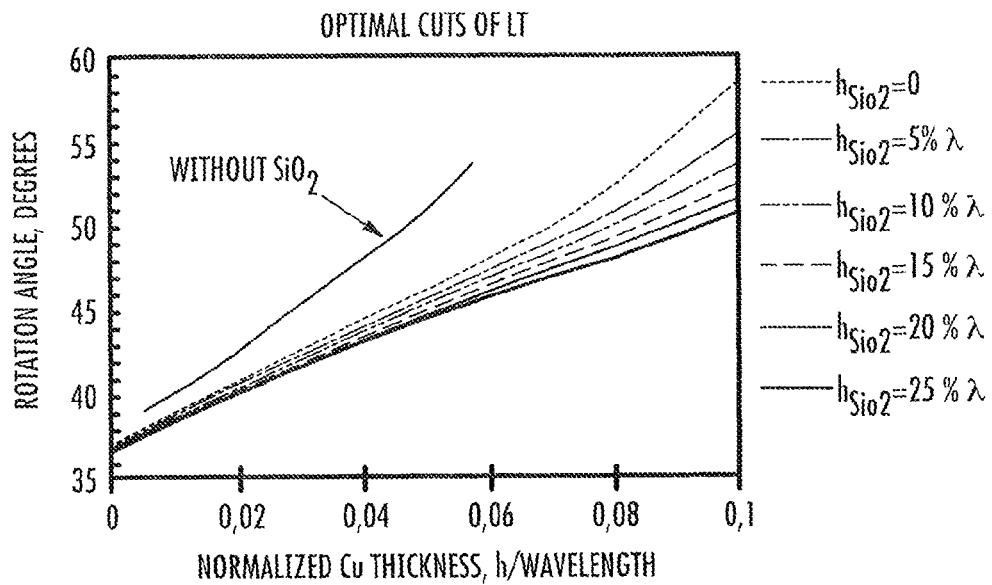
FIG. 20 is a diagram showing the relationship between optimal normalized electrode thickness and cut angle µ', for µ'-rotated YX cuts of $LiTaO_3$ with Cu as primary components of electrode material, when the thickness of $SiO_x$ film changes between zero and $h_{SiOx}=0.25\lambda$.
Figure 21:
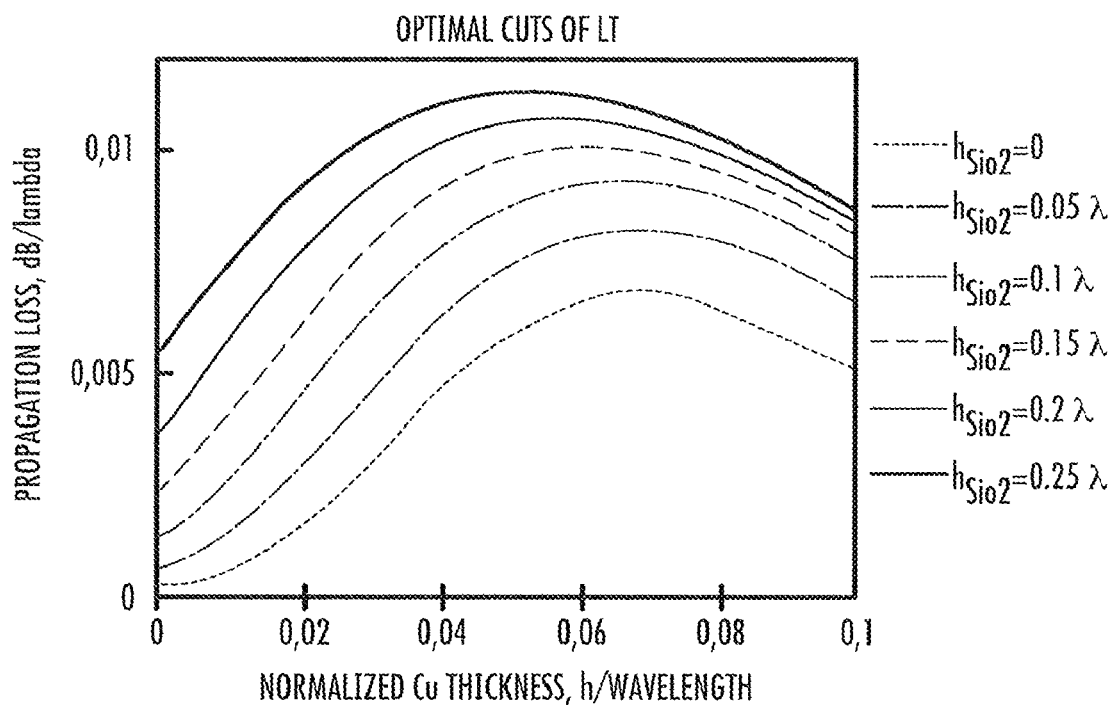
FIG. 21 graphically shows average propagation losses corresponding to the optimized thickness versus rotation angle dependences shown in FIG. 20, for λ'-rotated YX cuts of $LiTaO_3$ with Cu as primary component of electrode material.
Figure 22:
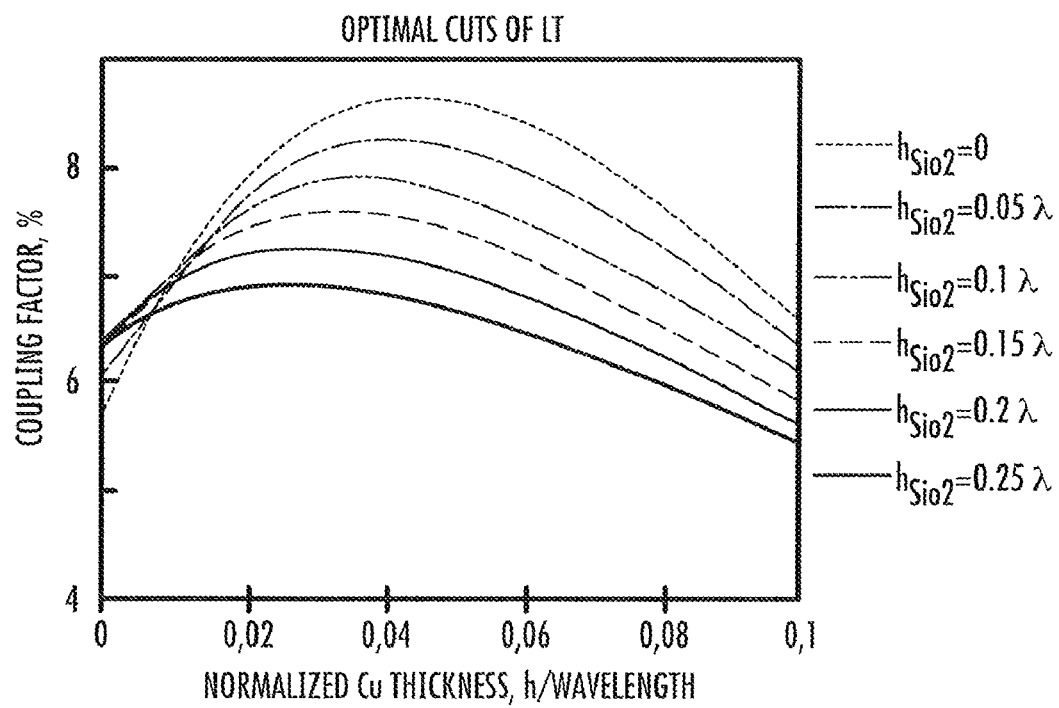
FIG. 22 graphically shows electromechanical coupling coefficient corresponding to the optimized thickness versus rotation angle dependences shown in FIG. 20, for µ'-rotated YX cuts of $LiTaO_3$ with Cu as primary component of electrode material.
Figure 23:
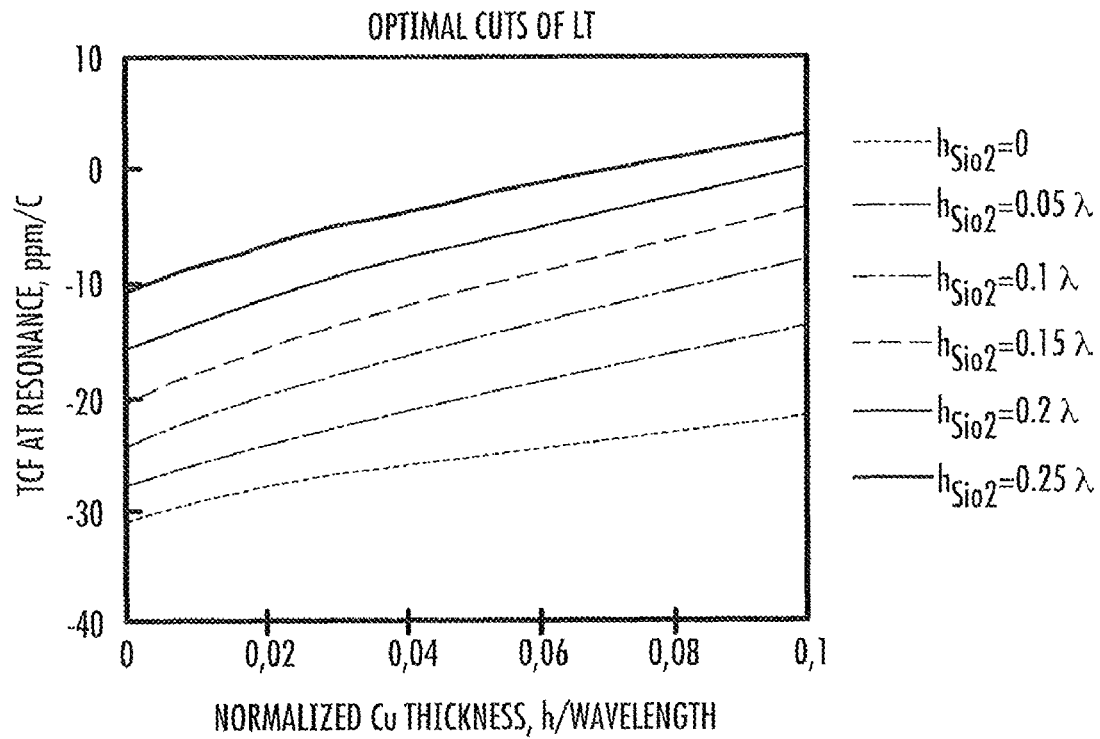
FIG. 23 graphically shows temperature coefficient of frequency estimated at resonant frequency, corresponding to the optimized thickness versus rotation angle dependences shown in FIG. 20, for µ'-rotated YX cuts of $LiTaO_3$ with Cu as primary component of electrode material.
Figure 24:
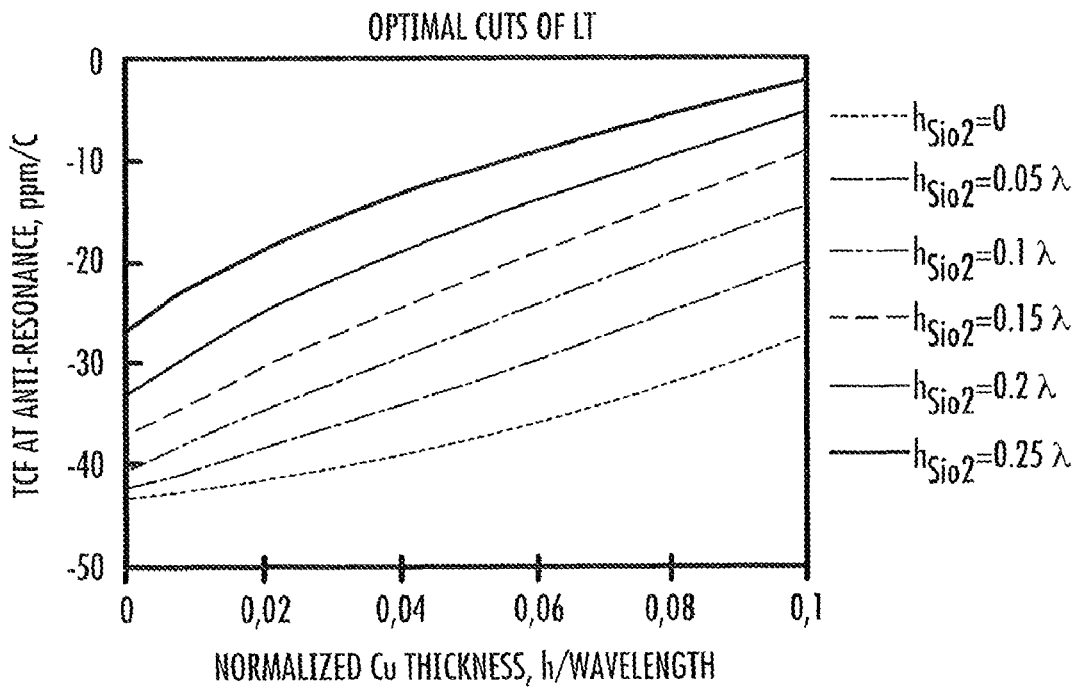
FIG. 24 graphically shows temperature coefficient of frequency estimated at anti-resonant frequency, corresponding to the optimized thickness versus rotation angle dependences shown in FIG. 20, for µ'-rotated YX cuts of $LiTaO_3$ with Cu as primary component of electrode material.
Figure 25:
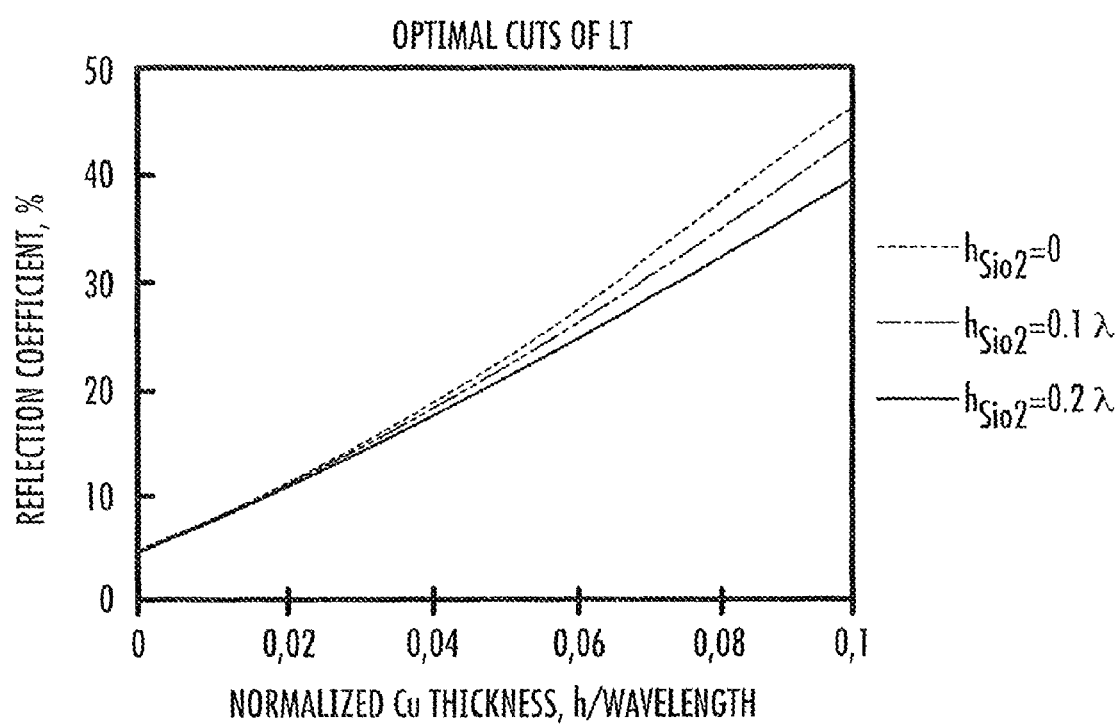
FIG. 25 graphically shows reflection coefficient per wavelength κ*2p, corresponding to the optimized thickness versus rotation angle dependences shown in FIG. 20, for µ'-rotated YX cuts of $LiTaO_3$ with Cu as primary component of electrode material.

The normalized thicknesses, $h_{Cu}$ and $h_{SiOx}$, are specified in % λ. These formulae describe the optimal dependences for different $SiO_x$ film thickness, in the interval between zero and 30% λ, as shown in FIG. 20. The main characteristics of LSAW are shown in FIGS. 21-25, as functions of normalized electrode thickness, provided that for each electrode and $SiO_x$ film thicknesses the rotation angle is optimized, to obtain simultaneously low and equal propagation losses at resonant and anti-resonant frequencies. It is desirable to have the propagation loss at resonant and anti-resonant frequencies to generally be within 0.01 dB/λ for a flat passband filter. FIGS. 21-25 show, respectively, propagation loss, electromechanical coupling $k^2$, TCF estimated at resonant and anti-resonant frequencies and reflection per wavelength.

By way of example, 46° YX cut of LT can be considered, with $h_{Cu}$=6% λ and $h_{SiOx}$=20% λ. For this combination of orientation and thicknesses, equal propagation losses, about 0.011 dB/λ, are expected at resonant and anti-resonant frequencies. The coupling $k^2$ is about 6.8% and the absolute value of TCF is less than 10 ppm/° C.

By way of further example, a second embodiment of the present invention is herein described as utilizing a rotated Y-cut of LN as a piezoelectric substrate, with rotation angle confined in the interval between 40° and 90°. To provide attenuation of LSAW lower than 0.02 dB/λ, rotation angle is selected for each electrode thickness, with Cu as primary electrode material, in the interval between zero and 3% λ and $SiO_x$ overlay thickness, in the interval between zero and 30% λ, according to the following Table 2:

TABLE 2

| $h_{SiOx}/\lambda$, % | $h_{Cu}/\lambda$, % | Rotation angle, degrees |
|---|---|---|
| 0 | 0-0.5 | 42-62 |
|  | 0.5-1 | 45-65 |
|  | 1-1.5 | 58-72 |
|  | 1.5-2 | 65-75 |
|  | 2-2.5 | 70-78 |
|  | 2.5-3 | 74-80 |
| 10 | 0-0.5 | 50-73 |
|  | 0.5-1 | 62-73 |
|  | 1-5 | 68-75 |
|  | 1.5-2 | 73-76 |
|  | 2-2.5 | 75-78 |
|  | 2.5-3 | 77-80 |
| 20 | 0-0.5 | 71-74 |
|  | 0.5-1 | 73-75 |
|  | 1-1.5 | 75-77 |
|  | 1.5-2 | 76-78 |
|  | 2-2.5 | 78-80 |
|  | 2.5-3 | 78-83 |

With these combinations of orientation and thicknesses of electrodes and $SiO_x$ overlay, the squared electromechanical coupling coefficients of LSAW are confined in the interval between 7.5% and 16.5%. The coupling can be increased to about 18%, if propagation loss is increased but is still less than 0.05 dB/λ. In this case, the optimal intervals of rotation angles are selected according to the following Table 3:

TABLE 3

| $h_{SiOx}/\lambda$, % | $h_{Cu}/\lambda$, % | Rotation angle, degrees |
|---|---|---|
| 0 | 0-0.5 | 40-67 |
|  | 0.5-1 | 40-72 |
|  | 1-1.5 | 45-75 |
|  | 1.5-2 | 55-78 |
|  | 2-2.5 | 65-83 |
|  | 2.5-3 | 70-84 |
| 10 | 0-0.5 | 40-76 |
|  | 0.5-1 | 48-75 |
|  | 1-1.5 | 62-79 |
|  | 1.5-2 | 67-82 |
|  | 2-2.5 | 72-83 |
|  | 2.5-3 | 74-85 |
| 20 | 0-0.5 | 65-78 |
|  | 0.5-1 | 67-80 |
|  | 1-1.5 | 72-82 |
|  | 1.5-2 | 73-83 |
|  | 2-2.5 | 74-85 |
|  | 2.5-3 | 74-87 |

In the previous two tables, for each rotation angle μ' in the found optimal intervals, orientation of LN substrate is determined by the Euler angles (0±3°, μ'−90, 0±3°) or (0±3°, μ'+90, 0±3°).

Figure 26:
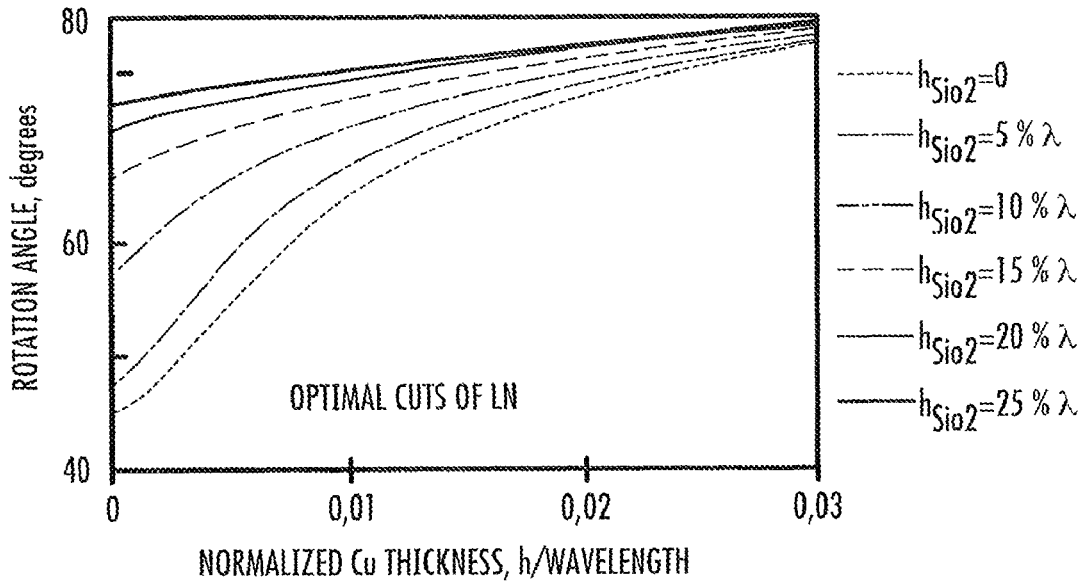
FIG. 26 is a diagram showing the relationship between optimal normalized electrode thickness and cut angle µ', for µ'-rotated YX cuts of $LiNbO_3$ with Cu as primary components of electrode material, when the thickness of $SiO_x$ film changes between zero and $h_{SiOx}=0.2\lambda$.
Figure 27:
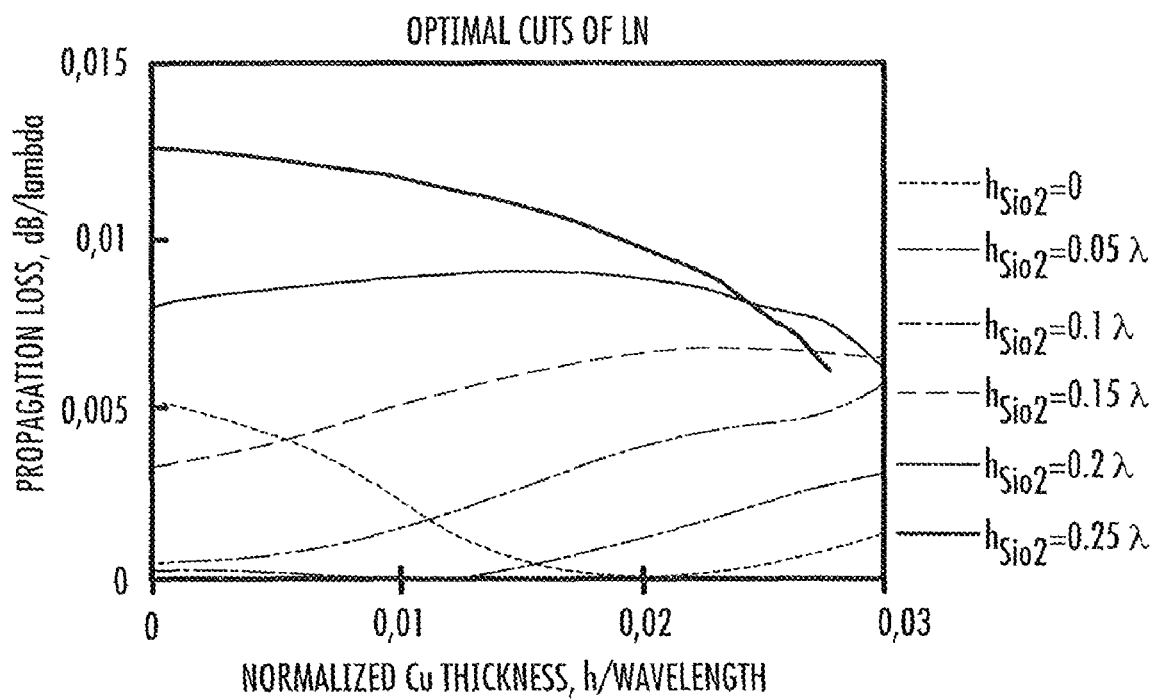
FIG. 27 graphically shows average propagation losses corresponding to the optimized thickness versus rotation angle dependences shown in FIG. 26, for µ'-rotated YX cuts of $LiNbO_3$ with Cu as primary component of electrode material.
Figure 28:
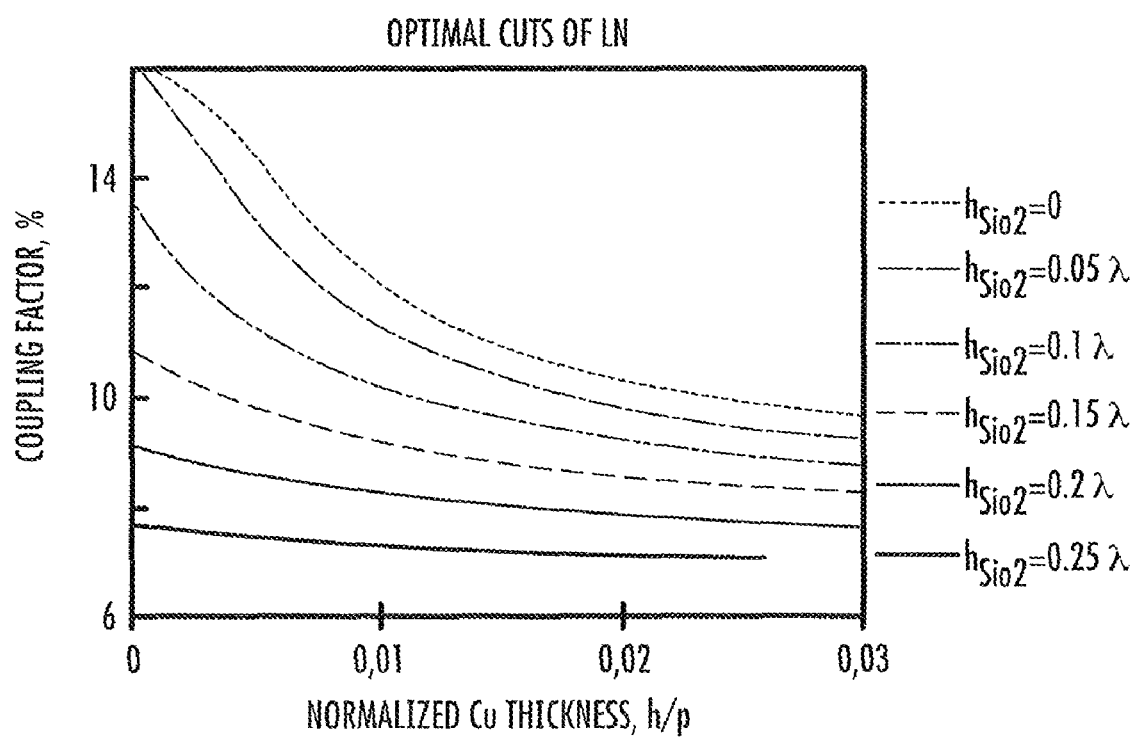
FIG. 28 graphically shows electromechanical coupling coefficient corresponding to the optimized thickness versus rotation angle dependences shown in FIG. 26, for µ'-rotated YX cuts of $LiNbO_3$ with Cu as primary component of electrode material.
Figure 29:
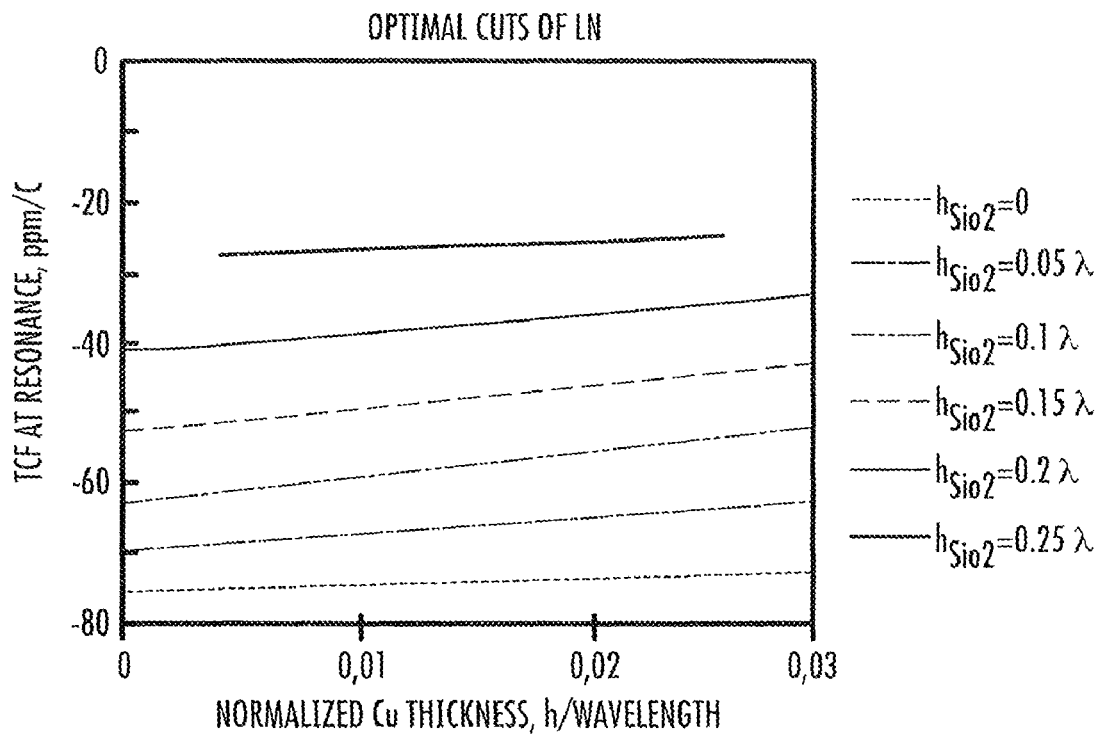
FIG. 29 graphically shows temperature coefficient of frequency estimated at resonant frequency, corresponding to the optimized thickness versus rotation angle dependences shown in FIG. 26, for µ'-rotated YX cuts of $LiNbO_3$ with Cu as primary component of electrode material.
Figure 30:
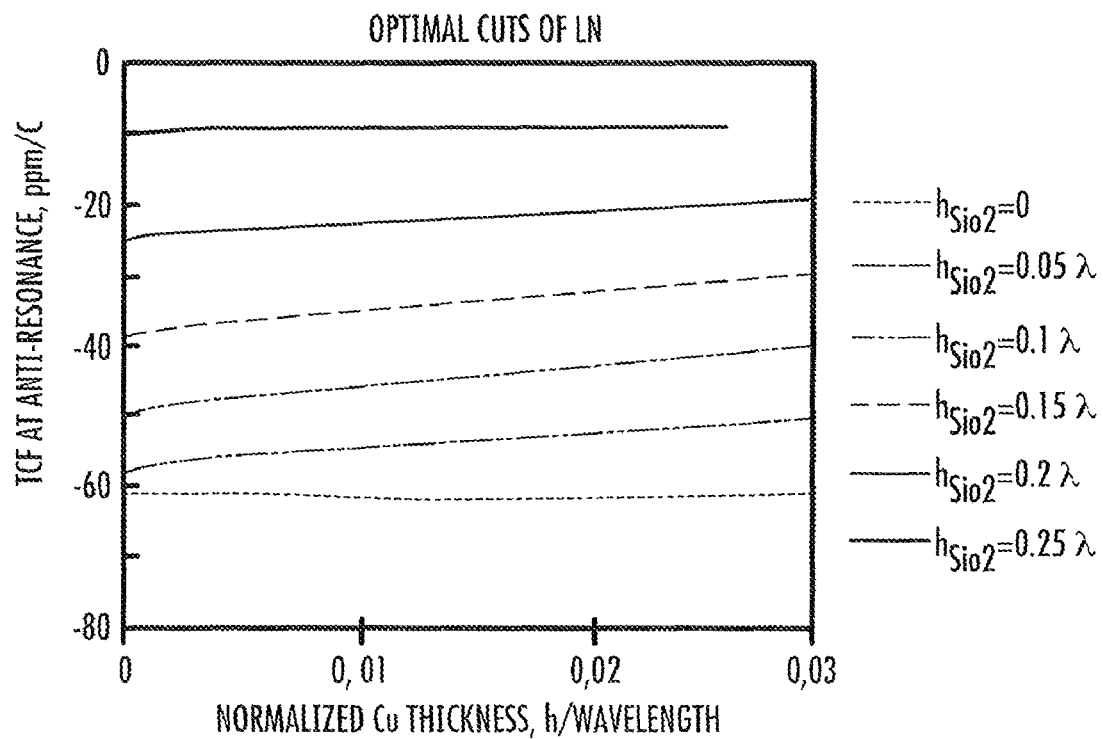
FIG. 30 graphically shows temperature coefficient of frequency estimated at anti-resonant frequency, corresponding to the optimized thickness versus rotation angle dependences shown in FIG. 26, for µ'-rotated YX cuts of $LiNbO_3$ with Cu as primary component of electrode material.
Figure 31:
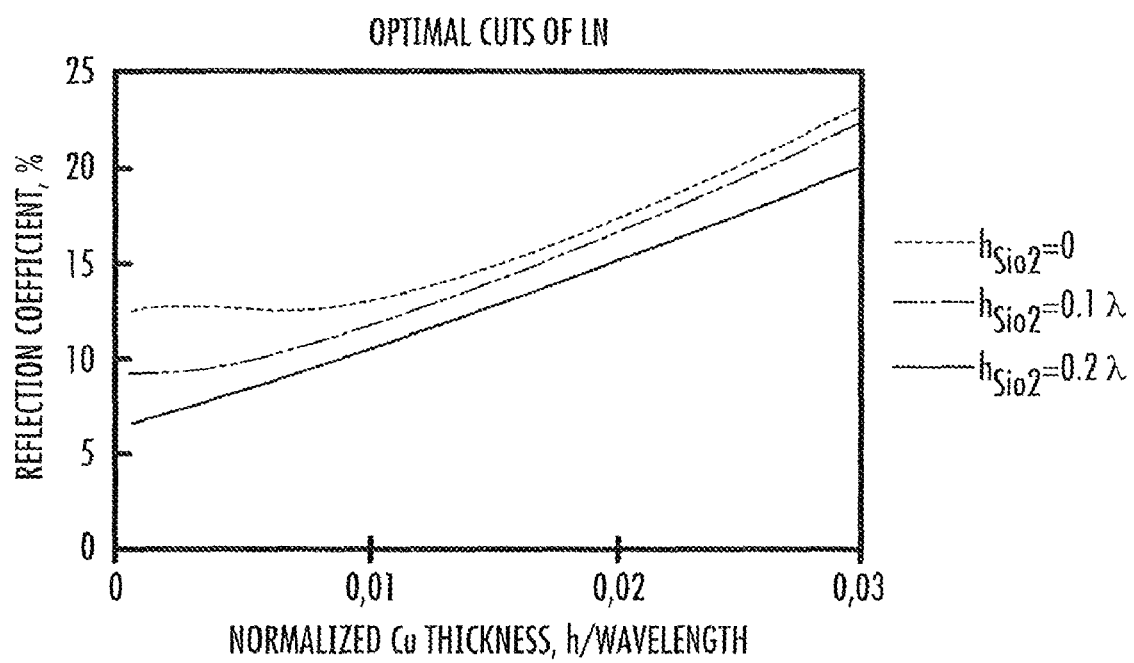
FIG. 31 graphically shows reflection coefficient, corresponding to the optimized thickness versus rotation angle dependences shown in FIG. 26, for µ'-rotated YX cuts of $LiNbO_3$ with Cu as primary component of electrode material.

To provide equal propagation losses at resonant and anti-resonant frequencies, rotation angle μ' is selected for each Cu electrode thickness and $SiO_x$ overlay thickness as $\mu'=\mu_{opt}\pm1°$, where the optimal value of rotation angle $\mu_{opt}$, in degrees, is determined by the following formulae $$\mu_{opt}=C_0+C_1\cdot h_{Cu}+C_2\cdot h_{Cu}^2+C_3^2\cdot h_{Cu}^3$$

where $$C_0=43.12-0.970\cdot h_{SiOx}+0.443\cdot h_{SiOx}^2-0.0246\cdot h_{SiOx}^3+4.123\cdot 10^{-4}\cdot h_{SiOx}^4$$

$$C_1=28.31+3.139\cdot h_{SiOx}-0.7254\cdot h_{SiOx}^2+0.0383\cdot h_{SiOx}^3-6.352\cdot 10^{-4}\cdot h_{SiOx}^4$$

$$C_2=-8.599-2.119\cdot h_{SiOx}+0.395\cdot h_{SiOx}^2-0.0201\cdot h_{SiOx}^3+3.282\cdot 10^{-4}\cdot h_{SiOx}^4$$

$$C_3=0.9937+0.3986\cdot h_{SiOx}-0.0677\cdot h_{SiOx}^2+0.00338\cdot h_{SiOx}^3-5.46\cdot 10^{-5}\cdot h_{SiOx}^4$$

and normalized thicknesses $h_{Cu}$ and $h_{SiOx}$ are specified in %λ. It is desirable to have the propagation loss at resonant and anti-resonant frequencies to generally be within 0.02 dB/λ to achieve a flat passband response on a LN buried IDT filter. The corresponding optimal dependences are shown in FIG. 26 while FIGS. 27-31 show, respectively, propagation loss, electromechanical coupling $k^2$, TCF estimated at resonant and anti-resonant frequencies and reflection per wavelength in the found optimal combinations.

Figure 1:
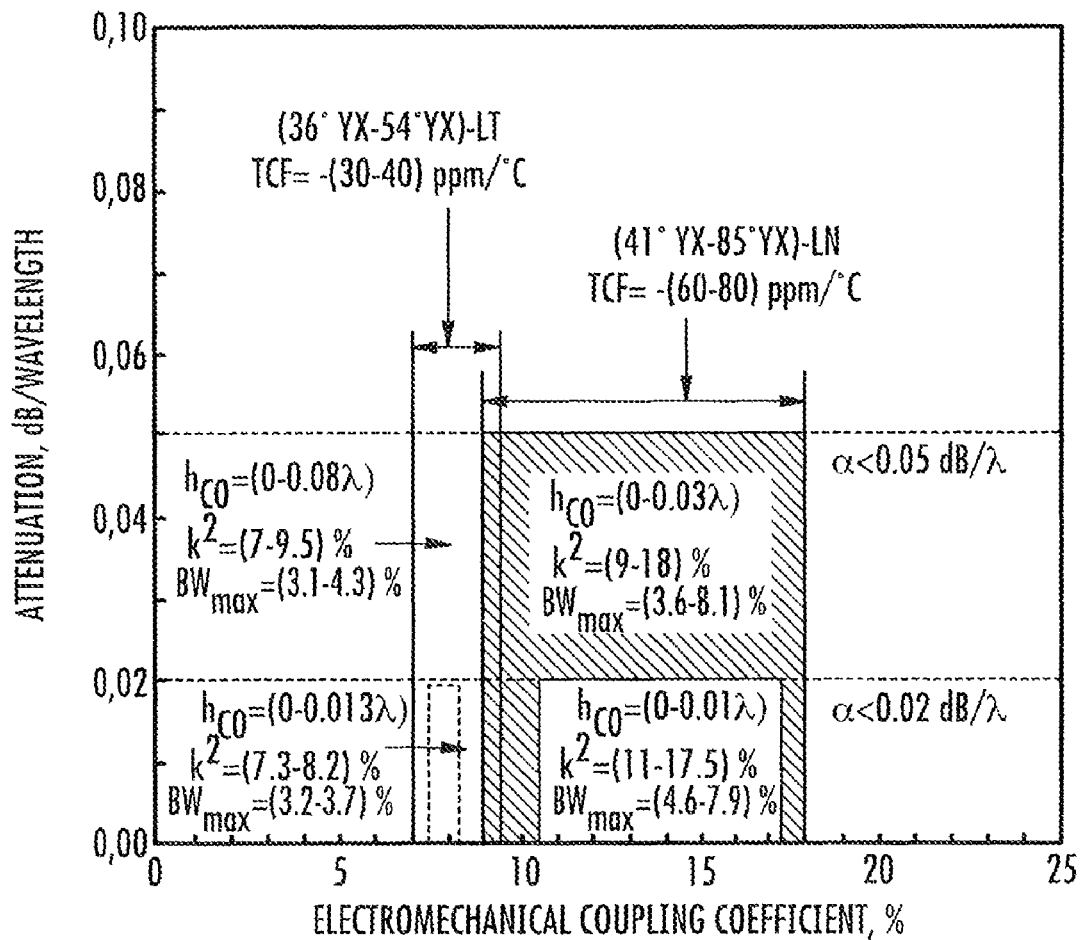
FIG. 1 schematically shows intervals of attenuation coefficients and electromechanical coupling factors which can be obtained for SH-type leaky waves propagating in rotated YX-cuts of LN and LT, without $SiO_x$ overlay.
Figure 32:
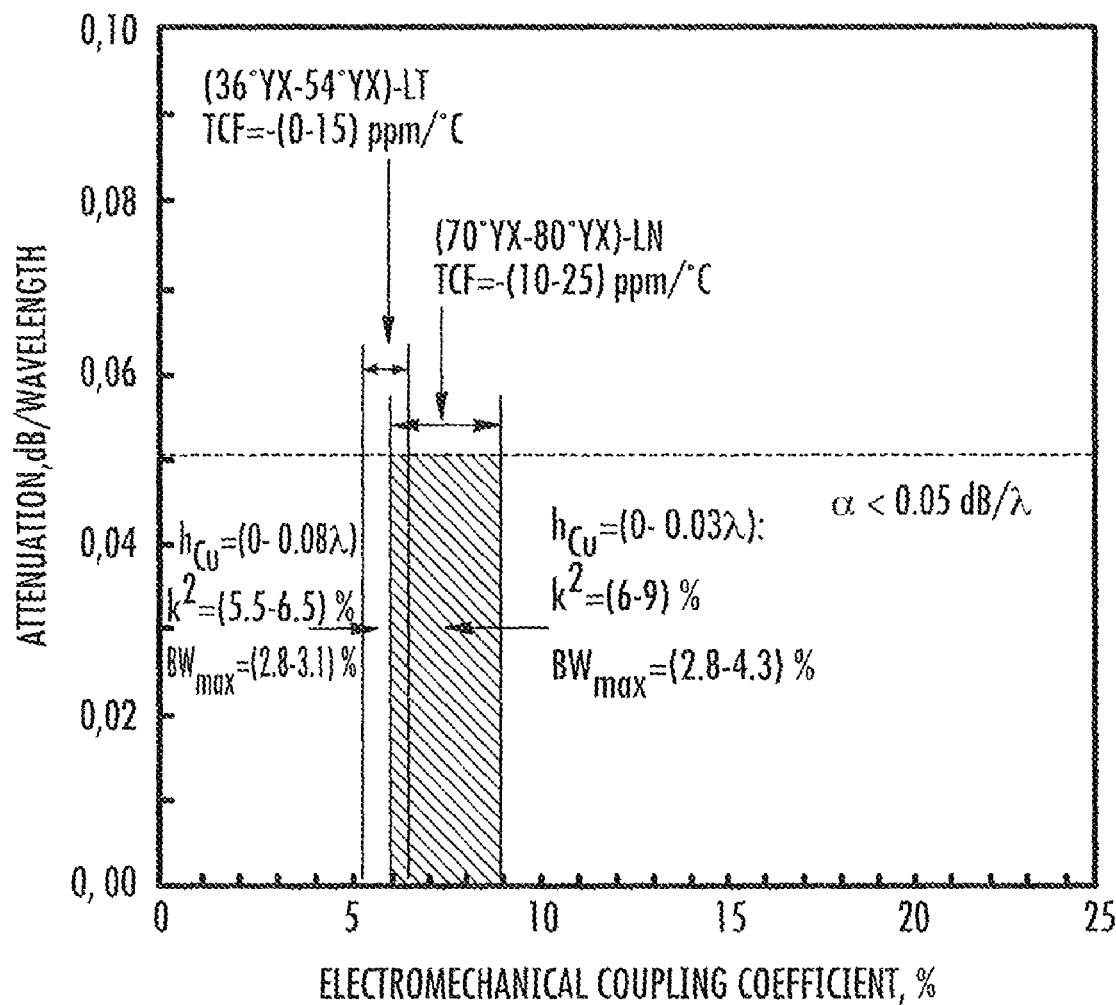
FIG. 32 schematically shows the intervals of attenuation coefficients and electromechanical coupling factors which can be obtained for SH-type leaky waves propagating in rotated YX-cuts of LN and LT, with $SiO_x$ film, when the thickness of SiOx overlay is $h_{SiOx}=0.25\lambda$.

By way of example, FIG. 32 summarizes the characteristics of LSAW, which can be provided if optimal orientation of LT or LN is utilized as a piezoelectric substrate, with resonator structure using Cu electrodes and $SiO_x$ overlay having thickness about 20% λ, in 36°-54° YX cuts of LT and 70°-80° YX cuts of LN. Due to $SiO_x$ overlay, TCF values are improved compared to TCF shown in FIG. 1, but maximum values of the coupling $k^2$ decrease with increasing $SiO_x$ film thickness, as well as maximum bandwidths of SAW devices with resonator-type structures utilizing such structures.

The characteristics of LSAW in rotated YX-cuts of LN and LT, along the optimal lines and around them, may change with variation of parameters of $SiO_x$ film. In particular, the values of TCF are most sensitive to the properties of $SiO_x$ film. However, the dependences between the optimal electrode thickness, with Cu as a primary component of electrode material, and rotation angle are mostly determined by anisotropy of a piezoelectric crystal, LT or LN, which is adequately characterized by the reported material constants of these crystals (see above referenced Kushibiki publication)

It is to be understood that even though numerous characteristics and advantages of the present invention have been set forth in the foregoing description, together with details of the structure and function of the invention, the disclosure is illustrative only, and changes may be made in detail, especially in the choice of type of SAW device, device orientation on the die, and shape size and arrangement of parts within the principles of the invention to the full extent indicated by the broad general meaning of the terms in which the appended claims are expressed.

That which is claimed is:

1. A surface acoustic wave device comprising:
   a piezoelectric substrate of a single crystal having symmetry 3 m for providing propagation of leaky waves with quasi-SH polarization and squared electromechanical coupling coefficient exceeding 5%;
   an electrode pattern disposed on a surface of the piezoelectric substrate, wherein the electrode pattern includes electrodes having a thickness and Cu as a primary electrode material, and wherein the electrode pattern forms a resonator;
   a dielectric overlay of silicon oxide having positive TCF, the dielectric overlay disposed between and over electrodes of the electrode pattern, wherein the dielectric overlay includes a generally flattened surface, the dielectric overlay having a thickness up to 30% λ, and wherein the thickness of the dielectric overlay, the thickness of the electrodes, and a rotation angle of the piezoelectric substrate are configured such that a propagation loss of the device at a resonant frequency is substantially equal to a propagation loss at an anti-resonant frequency, and do not exceed 0.02 dB/λ,
wherein the piezoelectric substrate includes LiTaO3 having an orientation defined by Euler angles (0±3°, μ, 0±3°), with the rotation angle μ=μ'−90°, where μ' ranges from about 36° to about 54°, wherein the thickness of the electrodes range from 0.1% λ to 10% λ, and wherein the Euler angles, which determine orientation of the piezoelectric substrate are dependent on the thickness of the electrodes and the thickness of the dielectric overlay, wherein μ'=μ$_{opt}$±1° where μ$_{opt}$ is determined according to the following:

$$\mu_{opt}=37.0+C_1 \cdot h_{Cu}+C_2 \cdot h_{Cu}^2+C_3 \cdot h_{Cu}^3$$

where
$h_{Cu}$ is the thickness of the electrodes;
$h_{SiOx}$ is the thickness of the dielectric overlay;

$$C_1=2.103-8.208 \cdot 10^{-2} \cdot h_{SiOx}+6.069 \cdot 10^{-3} \cdot h_{SiOx}^2-1.19 \cdot 10^{-4} \cdot h_{SiOx}^3;$$

$$C_2-0.1217+2.601 \cdot 10^{-2} \cdot h_{SiOx}-2.781 \cdot 10^{-3} \cdot h_{SiOx}^2+1.129 \cdot 10^{-4} \cdot h_{SiOx}^3-1.764 \cdot 10^{-6} \cdot h_{SiOx}^4;$$

$$C_3=0.0121-2.348 \cdot 10^{-3} \cdot h_{SiOx}+2.145 \cdot 10^{-4} \cdot h_{SiOx}^2-8.489 \cdot 10^{-6} \cdot h_{SiOx}^3+1.333 \cdot 10^{-7} \cdot h_{SiOx}^4;$$

and, wherein normalized thicknesses, $h_{Cu}$ and $h_{SiOx}$, are specified in % λ.

2. A SAW filter comprising:
a piezoelectric substrate of Lithium Tantalate, wherein the piezoelectric substrate includes an orientation defined by Euler angles (0±3°, μ, 0±3°), with angle μ=μ'−90°, where μ' ranges from about 36° to about 54°, and wherein the Euler angles which determine orientation of the piezoelectric substrate are dependent on an electrode thicknesses and a SiOx overlay thickness, wherein μ'=μ$_{opt}$±1° where μ$_{opt}$ is determined according to the following:

$$\mu_{opt}=37.0+C_1 \cdot h_{Cu}+C_2 \cdot h_{Cu}^2+C_3 \cdot h_{Cu}^3$$

wherein
$h_{Cu}$ is the thickness of the electrodes;
$h_{SiOx}$ is the SiOx overlay thickness;

$$C_1=2.103-8.208 \cdot 10^{-2} \cdot h_{SiOx}+6.069 \cdot 10^{-3} \cdot h_{SiOx}^2-1.19 \cdot 10^{-4} \cdot h_{SiOx}^3;$$

$$C_2-0.1217+2.601 \cdot 10^{-2} \cdot h_{SiOx}-2.781 \cdot 10^{-3} \cdot h_{SiOx}^2+1.129 \cdot 10^{-4} \cdot h_{SiOx}^3-1.764 \cdot 10^{-6} \cdot h_{SiOx}^4;$$

$$C_3=0.0121-2.348 \cdot 10^{-3} \cdot h_{SiOx}+2.145 \cdot 10^{-4} \cdot h_{SiOx}^2-8.489 \cdot 10^{-6} \cdot h_{SiOx}^3+1.333 \cdot 10^{-7} \cdot h_{SiOx}^4;$$

and, wherein normalized thicknesses, $h_{Cu}$ and $h_{SiOx}$, are specified in % λ;
a plurality of electrodes having the electrode thickness and an electrode pattern forming a resonator structure on a surface of the substrate, wherein each electrode comprises copper, and wherein the electrode thickness is within a range from 0.1% λ to 10% λ; and
an overlay of SiOx disposed on the surface of the substrate at least between the electrodes, wherein the overlay has the SiOx overlay thickness as measured above the electrodes including the resonator structure, wherein the SiOx overlay thickness is up to 40% λ.

3. A SAW filter comprising:
a piezoelectric substrate of Lithium Tantalate, wherein the piezoelectric substrate includes an orientation defined by Euler angles (0±3°, μ, 0±3°), with rotation angle μ=μ'−90°, where μ' ranges from about 36° to about 54°;
a plurality of electrodes having an electrode pattern forming a resonator structure on a surface of the substrate, wherein each electrode comprises copper; and
an overlay of SiOx disposed on the surface of the substrate at least between the electrodes, wherein
the Euler angles which determine orientation of the piezoelectric substrate are dependent on a thickness of the electrodes, $h_{Cu}$, and a thickness of the overlay, $h_{SiOx}$, according to:

| $h_{SiOx}/\lambda$, % | $h_{Cu}/\lambda$, % | Rotation angle, degrees |
|---|---|---|
| 0 | 0-2 | 40-45 |
|  | 2-4 | 43-47 |
|  | 4-6 | 46-49 |
|  | 6-8 | 47.5-51.5 |
|  | 8-10 | 49-54 |
| 10 | 0-2 | 39-44 |
|  | 2-4 | 42-45.5 |
|  | 4-6 | 44-47 |
|  | 6-8 | 46-49.5 |
|  | 8-10 | 47.5-51.5 |
| 20 | 0-2 | 39-43.5 |
|  | 2-4 | 41.5-45 |
|  | 4-6 | 43-46.5 |
|  | 6-8 | 44.5-48 |
|  | 8-10 | 46-50 |
| 30 | 0-2 | 39-42 |
|  | 2-4 | 41-43.5 |
|  | 4-6 | 42.5-45.5 |
|  | 6-8 | 43.5-47 |
|  | 8-10 | 44.5-48.5. |

* * * * *

UNITED STATES PATENT AND TRADEMARK OFFICE
CERTIFICATE OF CORRECTION

| | | |
|---|---|---|
| PATENT NO. | : 8,378,553 B1 | Page 1 of 1 |
| APPLICATION NO. | : 12/829101 | |
| DATED | : February 19, 2013 | |
| INVENTOR(S) | : Natalya Naumenko and Benjamin P. Abbott | |

It is certified that error appears in the above-identified patent and that said Letters Patent is hereby corrected as shown below:

In the Claims

Col. 13, line 23 [Claim 1.] "...$C_2$-0.1217..." should read – "...$C_2$=-0.1217...";

Col. 13, line 42 [Claim 2.] "...the thickness of the electrodes;" should read – "...the electrode thickness;";

Col. 13, line 47 [Claim 2.] "...$C_2$-0.1217..." should read – "...$C_2$=-0.1217...".

Signed and Sealed this
Twenty-fifth Day of November, 2014

Michelle K. Lee
*Deputy Director of the United States Patent and Trademark Office*